(12) United States Patent
Hosaka et al.

(10) Patent No.: US 7,458,469 B2
(45) Date of Patent: Dec. 2, 2008

(54) SUBSTRATE TRANSFER APPARATUS AND METHOD, AND STORAGE MEDIUM

(75) Inventors: Hiroki Hosaka, Nirasaki (JP); Toshihiko Iijima, Nirasaki (JP); Shinya Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 145 days.

(21) Appl. No.: 11/227,136

(22) Filed: Sep. 16, 2005

(65) Prior Publication Data

US 2007/0031222 A1 Feb. 8, 2007

(30) Foreign Application Priority Data

Aug. 5, 2005 (JP) ............... 2005-227868

(51) Int. Cl.
*B65G 49/07* (2006.01)

(52) U.S. Cl. ............... 211/41.18; 206/711; 414/416.08; 414/937

(58) Field of Classification Search ............ 414/416.03, 414/416.08, 937; 206/710, 711; 211/41.18
See application file for complete search history.

(56) References Cited

U.S. PATENT DOCUMENTS

| | | | | |
|---|---|---|---|---|
| 4,892,455 A | * | 1/1990 | Hine ............ | 414/416.03 |
| 5,183,370 A | * | 2/1993 | Cruz ............ | 414/416.03 |
| 5,219,079 A | * | 6/1993 | Nakamura ............ | 211/41.18 |
| 5,332,352 A | * | 7/1994 | Poduje et al. ............ | 414/744.5 |
| 5,387,067 A | * | 2/1995 | Grunes ............ | 414/217 |
| 5,730,574 A | * | 3/1998 | Adachi et al. ............ | 414/225.01 |
| 6,093,644 A | * | 7/2000 | Inaba et al. ............ | 438/680 |
| 6,171,400 B1 | * | 1/2001 | Wingo ............ | 118/500 |
| 6,253,118 B1 | * | 6/2001 | Koyama ............ | 700/218 |
| 6,593,045 B2 | | 7/2003 | Sato et al. | |
| 6,702,865 B1 | * | 3/2004 | Ozawa et al. ............ | 29/25.01 |
| 7,054,713 B2 | * | 5/2006 | Teng et al. ............ | 700/218 |
| 7,188,736 B2 | * | 3/2007 | Choi ............ | 211/41.18 |
| 2001/0014271 A1 | * | 8/2001 | Sl et al. ............ | 414/416.08 |
| 2003/0173316 A1 | * | 9/2003 | Park et al. ............ | 211/41.18 |
| 2004/0256284 A1 | * | 12/2004 | Nanjo ............ | 206/710 |
| 2006/0032826 A1 | * | 2/2006 | Liu ............ | 211/41.18 |

FOREIGN PATENT DOCUMENTS

| | | | |
|---|---|---|---|
| JP | 6-156624 | * | 6/1994 |
| JP | 6-163667 | | 6/1994 |
| JP | 2000-91400 | * | 3/2000 |
| JP | 2002-203890 | | 7/2002 |
| JP | 2003-224177 | | 8/2003 |
| KR | 2002-0006469 | | 1/2002 |
| KR | 20-0331986 | | 11/2003 |

* cited by examiner

*Primary Examiner*—James Keenan
(74) *Attorney, Agent, or Firm*—Oblon, Spivak, McClelland, Maier & Neustadt, P.C.

(57) ABSTRACT

In a substrate transfer apparatus, an adaptor unit 25 includes a box-shaped main body 40 having three open sides; and a plurality of stage arms 41 disposed in the main body 40, serving as substrate mounting members. Each of the stage arms 41 has a disc-shaped wafer supporting portion 411 disposed at an approximately central portion of the main body 40 and a flat body 412 disposed in the main body 40 so as not to interfere with the moving paths of transfer arms 241 and 341. Formed at a connecting portion of the wafer supporting portion 411 and the body 412 are cutout portions 413 for preventing interference between the stage arms 41 and two prongs of leading end portions of the transfer arms 241 and 341 introduced into the main body 40.

12 Claims, 13 Drawing Sheets

SUBSTRATE TRANSFER APPARATUS AND METHOD, AND STORAGE MEDIUM

FIELD OF THE INVENTION

The present invention relates to a substrate transfer apparatus and method and a storage medium; and, more particularly, to a substrate transfer apparatus capable of transferring a substrate by using two transfer arms for carrying the substrate in different directions, respectively.

BACKGROUND OF THE INVENTION

As for a system for inspecting a wafer, sheet by sheet, as a substrate having thereon semiconductor devices, there has been known an inspecting system including a plurality of probers as an inspection apparatus and at least one rail guided vehicle (RGV) as a substrate carrier for supplying a wafer to be inspected to each of the probers and then unloading the inspected wafer therefrom.

Each prober includes a prober unit for receiving a wafer and then inspecting a surface thereof and a loader unit for loading a wafer supplied from the RGV into the prober unit and then unloading the inspected wafer therefrom. The loader unit has a box-shaped adaptor unit serving as a temporary storage device for temporarily storing the supplied wafer or the inspected wafer; and a loader transfer arm for transferring the wafer between the adaptor unit and the prober unit. Further, the adaptor unit has a table for mounting thereon the wafer.

The RGV includes a wafer carrier for storing therein a plurality of wafers and an RGV transfer arm for transferring the wafers between the wafer carrier and the adaptor unit of the prober.

The adaptor unit serves as a substrate transfer apparatus for transferring the wafer to the loader transfer arm and the RGV transfer arm. Further, the adaptor unit is configured such that the table does not interfere with each of the transfer arms in moving directions of the loader transfer arm and the RGV transfer arm. In other words, a moving path of each transfer arm is provided in the adaptor unit.

For example, in the adaptor unit 100 illustrated in FIG. 10, the table is formed by four supporting members 101 protruded from corner portions of the adaptor unit 100. Since the supporting members are spaced from each other, the approach path of each transfer arm, e.g., the loader transfer arm 102, is allowed (see, e.g., Japanese Patent Laid-open Publication NO. H6-163667). In such adaptor unit 100, the four supporting members 101 support a peripheral portion of the wafer W at four locations.

Meanwhile, if the wafer mounted on the table of the adaptor unit is severely misaligned, the wafer is not loadable into the prober unit. Accordingly, there has been developed an adaptor unit and a method for correcting the misalignment of a wafer.

As for an adaptor unit for correcting the misalignment of a wafer, there is known an adaptor unit 110 having a centering device shown in FIG. 11. The adaptor unit 110 includes a wafer support 111 for mounting thereon the wafer W loaded by the RGV transfer arm; a pair of centering plates 112 disposed at both sides of the wafer support 111 so as to surround the mounted wafer W; and an extending and contracting mechanism for extending and contracting the centering plate 112. In such adaptor unit 110, when a gap between the pair of centering plates 112 is shortened, the centering plates 112 are contacted with a peripheral surface of the wafer W mounted on the wafer support 111, thereby centering the wafer W (see, e.g., Japanese Patent Laid-open Publication NO. 2003-224177).

Further, in the adaptor unit 110, the centered wafer W is accommodated in a wafer chamber 113 provided at a lower portion of the adaptor unit 110. Provided in the wafer chamber 113 are supporting members 114a and 114b for supporting the peripheral portion of the wafer W at two locations. The supporting members 114a and 114b serve as a table of the wafer W.

As for a method for correcting the misalignment of the wafer, there is known a method for contacting the wafer W mounted on the RGV transfer arm 121 with a wall of the carrier 120 for accommodating therein the wafer W, as described in FIG. 12. To be specific, the wafer W is mounted on the RGV transfer arm 121 without being adsorbed and, then, the RGV transfer arm 121 moves into the carrier 120. Next, the peripheral portion of the wafer W is contacted with an inner wall of the carrier 120. In such state, the RGV transfer arm 121 is extended. At this time, a relative position of the wafer W with respect to the RGV transfer arm 121 changes. When the RGV transfer arm 121 is extended to a specific position, the wafer W is adsorbed by the RGV transfer arm 121 (see, e.g., Japanese Patent Laid-open Publication No. 2002-203890).

By properly setting the relative position of the RGV transfer arm 121 with respect to the carrier 120, it is possible to adjust the relative position of the RGV transfer arm 121 with respect to the wafer W and further to center the wafer W. The peripheral portion of the centered wafer W is supported at two locations by the supporting members 122a and 122b protruded from the inner wall of the carrier 120, wherein the supporting members 122a and 122b face each other with the wafer W therebetween.

However, in the aforementioned adaptor units or carriers, a plurality of supporting members support at least two locations of the peripheral portion of the wafer W. Thus, if heights of supporting members are different, the wafer W becomes inclined, which inhibits a proper transfer of the wafer W. An inclination of the wafer W may cause a second misalignment of the wafer W.

Moreover, in the aforementioned adaptor units or carriers, since plurality of supporting members support at least two locations of the peripheral portion of the wafer W, only a single sized wafer W can be supported and, thus, wafers W of various sizes cannot be supported and properly transferred.

SUMMARY OF THE INVENTION

It is, therefore, an object of the present invention to provide a substrate transfer apparatus and method and a storage medium capable of properly transferring substrates of various sizes.

In accordance with one aspect of the invention, there is provided a substrate transfer apparatus formed of a box-shaped structure having at least two open sides, for temporarily keeping a substrate and transferring the substrate to at least two transfer arms introduced therein from the respective two open sides, the apparatus including: a substrate mounting member having a substrate supporting portion for supporting a central portion of the substrates and a body connected to the substrate supporting portion, the body disposed so as not to interfere with moving paths of the two transfer arms, wherein the substrate mounting member has cutout portions corresponding to shapes of leading ends of the two transfer arms.

In accordance with the aforementioned substrate transfer apparatus, by supporting a central portion of the substrate kept in the apparatus, it is possible to avoid an inclination of the substrate and to support various wafers having different sizes. Accordingly, the substrate can be properly transferred. Further, since the substrate mounting member has cutout portions corresponding to shapes of leading ends of the two transfer arms, the interference between the transfer arms and the substrate mounting member can be prevented and, accordingly, a misalignment and a drop of the substrate can be prevented. As a result, it is possible to properly transfer the substrate in different directions.

Preferably, the substrate supporting portion has a disc-shape.

In accordance with such substrate transfer apparatus, since the substrate supporting portion has a disc-shape, the substrate can be stably supported and, accordingly, the inclination of the substrate can be certainly prevented.

Preferably, the substrate mounting member adsorbs the substrate.

In accordance with such substrate transfer apparatus, since the substrate mounting member adsorbs the substrate, the misalignment and the drop of the substrate can be certainly prevented.

Preferably, the aforementioned substrate transfer apparatus further includes a substrate misalignment detecting sensor provided at a position corresponding to a peripheral portion of the substrate mounted on the substrate mounting member.

In accordance with such substrate transfer apparatus, since the substrate misalignment detecting sensor is disposed at a position corresponding to the peripheral portion of the substrate mounted on the substrate mounting member, the misalignment of the substrate can be certainly detected and, accordingly, it is possible to prevent the drop or the like of the substrate in advance.

Preferably, the substrate mounting member is provided in plural.

In accordance with such substrate transfer apparatus, since a plurality of the substrate mounting members are provided, the loading of the substrate can be quickly carried out. Further, while a substrate is being inspected, another substrate can be kept; therefore, the flexibility in the transfer of the substrate in an inspection system can be increased.

Preferably, the aforementioned substrate transfer apparatus further includes a substrate position alignment mechanism for carrying out a position alignment of the substrate, wherein the substrate position alignment mechanism has two substrate contact members provided symmetrically with respect to a substrate transfer directions of the transfer arms, the two substrate contact members being contacted with the substrate transferred by the transfer arm.

In accordance with such substrate transfer apparatus, the substrate transferred by the transfer arms contacts with the substrate contact members provided symmetrically with respect to the direction in which the substrate is transferred by the transfer arms, so that it is possible to carry out a position alignment of the substrate with respect to the transfer arms. Accordingly, the misalignment of the substrate can be certainly prevented, thereby enabling to effectively transfer the substrate.

Preferably, in the substrate contact members, a contact portion with the transferred substrate has an arc shape as viewed from a direction vertical to a surface of the substrate.

In accordance with such substrate transfer apparatus, since the contact portions of the substrate contact members with the transferred substrate have a symmetric arc shape as viewed from the vertical direction to a surface of the substrate, the substrate comes in point contact with each of the substrate contact members. As a result, the substrate can be stably contacted with the substrate contact members. Further, a different sized substrate can also be stably in contact with each of the substrate contact members.

Preferably, the contact portion of the substrate contact members with the transferred substrate is linearly formed in the vertical direction to the surface of the substrate.

In accordance with such substrate transfer apparatus, since the contact portions of the substrate contact members with the transferred substrate are linearly formed in the vertical direction, it is possible to increase the flexibility of the contact position in the vertical direction. Accordingly, the substrate can be stably contacted with the substrate contact members.

Preferably, the substrate position alignment mechanism is provided as many as the number of the substrate mounting members.

In accordance with such substrate transfer apparatus, the wafer position alignment mechanism is provided as many as the number of the substrate mounting members, so that in case the plurality of the substrate mounting members are installed, it is possible to carry out the position alignment of the substrate mounted on each of the substrate mounting members. As a result, an efficiency of the substrate transfer can be improved.

Preferably, the aforementioned substrate transfer-apparatus further includes jig engaging holes for specifying a position of a substrate contact member position aligning jig with respect to the substrate transfer apparatus, the substrate contact member position aligning jig serving to adjust positions of the respective substrate contact members of the substrate position alignment mechanism.

In accordance with such substrate transfer apparatus, since there is provided the jig engaging holes for specifying a position of the substrate contact member position alignment jig with respect to the substrate transfer apparatus, the position of the substrate contact member position alignment jig can be stably determined and, thus, the positions of the respective substrate contact members can be stably adjusted.

Preferably, the substrate contact members and the substrate mounting member are formed by separate members.

In accordance with such substrate transfer apparatus, the substrate contact members and the substrate mounting member are formed by separate members, so that they are not restricted by each other. As a result, a position of the substrate mounted on the substrate mounting member is not restricted by the substrate contact members, thereby enabling to prevent an inclination of the substrate.

Preferably, the substrate contact members and the substrate mounting member are spaced apart from each other by a specific distance in a direction vertical to the surface of the transferred substrate.

In accordance with such substrate transfer apparatus, since the substrate contact members and the substrate mounting member are spaced apart from each other by a specific distance in the vertical direction to the surface of the transferred substrate, it is possible to certainly prevent the substrate transferred between the substrate contact members and the substrate mounting member from being interfered by the substrate contact members or the substrate mounting member, thereby enabling to more stably transfer the substrate.

Preferably, the specific distance ranges from 8 mm to 11 mm.

In accordance with such substrate transfer apparatus, since the specific distance ranges from 8 mm to 11 mm, the substrate can be stably transferred.

In accordance with another aspect of the invention, there is provided a substrate transfer method for a substrate transfer apparatus formed of a box-shaped structure having at least two open sides, the substrate transfer apparatus temporarily keeping a substrate and transferring the substrate to at least two transfer arms introduced therein from the respective two open sides, the method including the steps of: loading the substrate into the substrate transfer apparatus; and supporting a central portion of the loaded substrate.

In accordance with such substrate transfer method, by supporting the central portion of the substrate loaded in the substrate transfer apparatus, it is possible to avoid an inclination of the substrate and to support various substrates having different sizes. Accordingly, the substrate can be properly transferred.

Preferably, the aforementioned substrate transfer method further includes the steps of: transferring the supported substrate by using the transfer arm; and making the transferred substrate come in contact with two substrate contact members disposed symmetrically with respect to a substrate transfer direction.

In accordance with such substrate transfer method, the substrate transferred by the transfer arm is contacted with the two substrate contact members provided symmetrically with respect to the direction in which the substrate is transferred by the transfer arm, so that it is possible to carry out a position alignment of the substrate with respect to the transfer arms. Accordingly, the misalignment of the substrate can be certainly prevented, thereby enabling to effectively transfer the substrate.

Preferably, the aforementioned substrate transfer method further includes the steps of: moving the transfer arm to a specific position after the substrate is contacted with the substrate contact members; adsorbing the substrate after the transfer arm is moved to the specific position; and transferring the substrate by a specific distance in a reverse direction of the substrate transfer direction of the transfer arm.

In accordance with the substrate transfer method, since the transfer arm is moved to a specific position after the substrate is contacted with the substrate contact members, it is possible to adjust the position of the substrate with respect to the transfer arms. Further, after the transfer arm is moved to the specific position, the substrate is transferred by a specific distance in a reverse direction of the substrate transfer direction while being adsorbed. Thus, the substrate can be separated by a distance from the substrate contact members without changing a relationship between the transfer arm and the position-aligned substrate. As a result, the substrate can be properly transferred.

Preferably, the aforementioned substrate transfer method further includes a step of detecting a position of a peripheral portion of the substrate whose central portion is supported.

In accordance with such substrate transfer method, by detecting a position of the peripheral portion of the substrate whose central portion is supported, the misalignment of the substrate can be certainly detected and, accordingly, it is possible to prevent the drop or the like of the substrate in advance.

Preferably, in the step of loading the substrate, the transfer arm simultaneously loads a plurality of the substrates into the substrate transfer apparatus.

In accordance with such substrate transfer method, since a plurality of the substrates are simultaneously loaded into the substrate transfer apparatus, the loading of the substrates can be quickly carried out.

Preferably, the substrate transfer directions of the two transfer arms are at right angle to each other.

In accordance with such substrate transfer method, the substrate transfer directions of the two transfer arms are at right angle to each other, so that the two transfer arms can be efficiently arranged. Accordingly, it is possible to miniaturize the substrate inspecting system having the substrate transfer apparatus.

In accordance with still another aspect of the invention, there is provided a computer readable storage medium storing a program for executing in a computer a substrate transfer method for a substrate transfer apparatus formed of a box-shaped structure having at least two open sides, the substrate transfer apparatus temporarily keeping. a substrate and transferring the substrate to at least two transfer arms introduced therein from the respective two open sides, wherein the program includes: a substrate loading module for loading the substrate into the substrate transfer apparatus; and a substrate supporting module for supporting a central portion of the loaded substrate.

In accordance with storage medium, by supporting the central portion of the substrate loaded in the substrate transfer apparatus, it is possible to avoid an inclination of the substrate and to support various substrates having different sizes. Accordingly, the substrate can be properly transferred.

Preferably, the program further includes: a substrate transfer module for transferring the supported substrate by using the transfer arm; and a contacting module for making the transferred substrate come in contact with two substrate contact members provided symmetrically with respect to a substrate transfer direction.

In accordance with such storage medium, the substrate transferred by the transfer arm is contacted with the two substrate mounting members provided symmetrically with respect to the direction in which the substrate is transferred by the transfer arm, so that it is possible to carry out a position alignment of the substrate with respect to the transfer arms. Accordingly, the misalignment of the substrate can be certainly prevented, thereby enabling to effectively transfer the substrate.

Preferably, the programs further includes: a transfer arm moving module for moving the transfer arm to a specific position after the substrate is contacted with the substrate contact members; a substrate adsorbing module for adsorbing the substrate after the transfer arm is moved to the specific position; and a reverse transfer module for transferring the substrate by a specific distance in a reverse direction of the substrate transfer direction of the transfer arm.

In accordance with the storage medium, since the transfer arm is moved to a specific position after the substrate is contacted with the substrate contact members, it is possible to adjust the position of the substrate with respect to the transfer arms. Further, after the transfer arm is moved to the specific position, the substrate is transferred by a specific distance in a reverse direction of the substrate transfer direction while being adsorbed. Thus, the substrate can be separated by a distance from the substrate contact members without changing a relationship between the transfer arm and the position-aligned substrate. As a result, the substrate can be properly transferred.

Preferably, the program has a detecting module for detecting a position of a peripheral portion of the substrate whose central portion is supported.

In accordance with such storage medium, by detecting a position of the peripheral portion of the substrate whose central portion is supported, the misalignment of the substrate can be certainly detected and, accordingly, it is possible to prevent the drop or the like of the substrate in advance.

Preferably, in the substrate loading module of the aforementioned storage medium, the transfer arm simultaneously loads a plurality of the substrates into the substrate transfer apparatus.

In accordance with such storage medium, since a plurality of the substrates are simultaneously loaded into the substrate transfer apparatus, the loading of the substrates can be quickly carried out.

Preferably, the substrate transfer directions of the two transfer arms are at right angle to each other.

In accordance with such storage medium, the substrate transfer directions of the two transfer arms are at right angle to each other, so that the two transfer arms can be efficiently arranged. Accordingly, it is possible to miniaturize the substrate inspecting system having the substrate transfer apparatus.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Hereinafter, preferred embodiments of present invention will be described with reference to the accompanying drawings.

Figure 1:
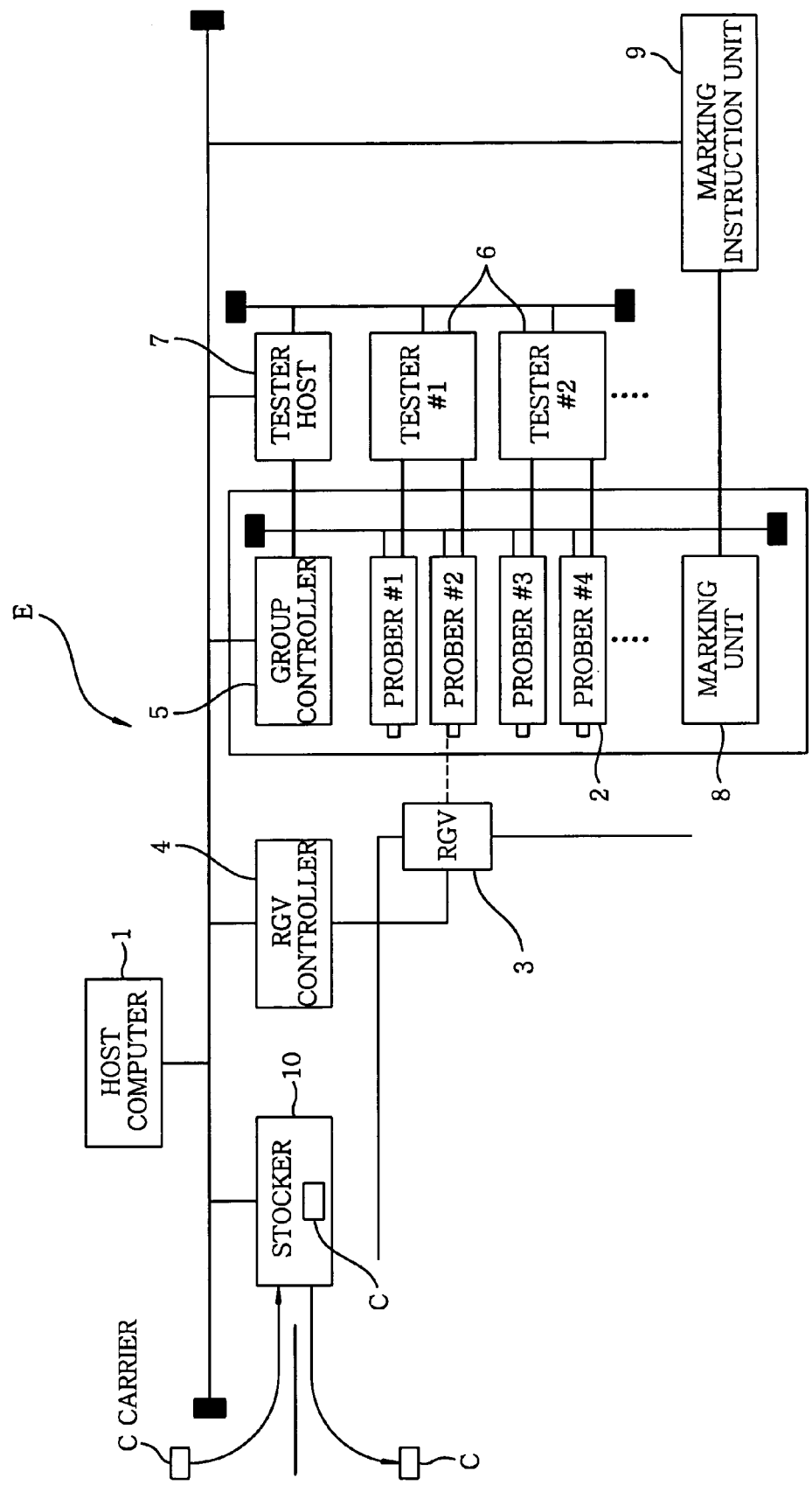
FIG. 1 is a block diagram showing a schematic composition of a substrate inspecting system employing a substrate transfer apparatus in accordance with a preferred embodiment of the present invention.

FIG. 1 is a block diagram showing a schematic composition of a substrate inspecting system employing a substrate transfer apparatus in accordance with a preferred embodiment of the present invention.

Referring to FIG. 1, a substrate inspecting system E includes a host computer 1 for managing an entire manufacturing process including an inspection process of a wafer W as a substrate having thereon a semiconductor device; a plurality of probers 2 as an inspection apparatus for inspecting electrical characteristics of the wafer W under the management of the host computer 1; a plurality of automatic transfer apparatuses (hereinafter, referred to as "RGV") for loading various wafers W of different diameters and automatically transferring the wafers W according to demands of the probers 2; and a transfer controller 4 (hereinafter, referred to as "RGV controller") for controlling the RGVs 3.

The probers 2 and the RGVs 3 have optically-coupled parallel I/O (hereinafter, referred to as "PIO") communication interfaces based on an SEMI standard E23 or E84 and deliver the wafers W sheet by sheet while carrying out a PIO communication therebetween. The probers 2 are configured as single wafer probers 2 to inspect the wafers W sheet by sheet. Hereinafter, the single wafer probers 2 are referred as probers 2. Further, the RGV controller 4 is connected to the host computer 1 via a semiconductor equipment communication standard (SECS) communication line, thereby controlling the RGVs 3 under the management of the host computer 1 and managing the wafers W in a lot unit.

In the aforementioned substrate inspecting system, instead of the RGVs 3, an automatic guided vehicle (AGV) can be used as an automatic transfer apparatus. Further, other than the RGVs 3 and the AGV, the substrate inspecting system E may include an OHT for transferring the wafer W along a ceiling path or the like.

Moreover, the plurality of probers 2 is connected to the host computer 1 via a group controller 5 through the SECS communication line. The host computer 1 manages the probers 2 via the group controller 5.

The group controller 5 manages information on an inspection of recipe data, log data or the like. Testers 6 are connected to the probers 2 through the SECS communication line, and each of the probers 2 carries out a specific inspection according to instructions from the corresponding testers 6. Each of the testers 6 is connected to the host computer 1 via a tester host computer 7 (hereinafter, referred to as "tester host") through the SECS communication line. The host computer 1 manages the testers 6 via the tester host 7.

Connected to the host computer 1 is a marking unit 8 for performing a specific marking process based on an inspection result of the wafer W via a marking instruction unit 9 composed of a PC, for example. The marking instruction unit 9 instructs the marking unit 8 to perform the marking process based on data managed by the tester host 7.

Further, a stocker 10 for storing therein a plurality of carriers C is connected to the host computer 1 through the SECS communication line. Each of the carriers C accommodates therein a plurality of uninspected/inspected wafers W. Under the management of the host computer 1, the stoker 10 stores and distributes the carriers having therein the uninspected/inspected wafers W and loads/unloads the wafers W on a carrier basis.

Figure 2:
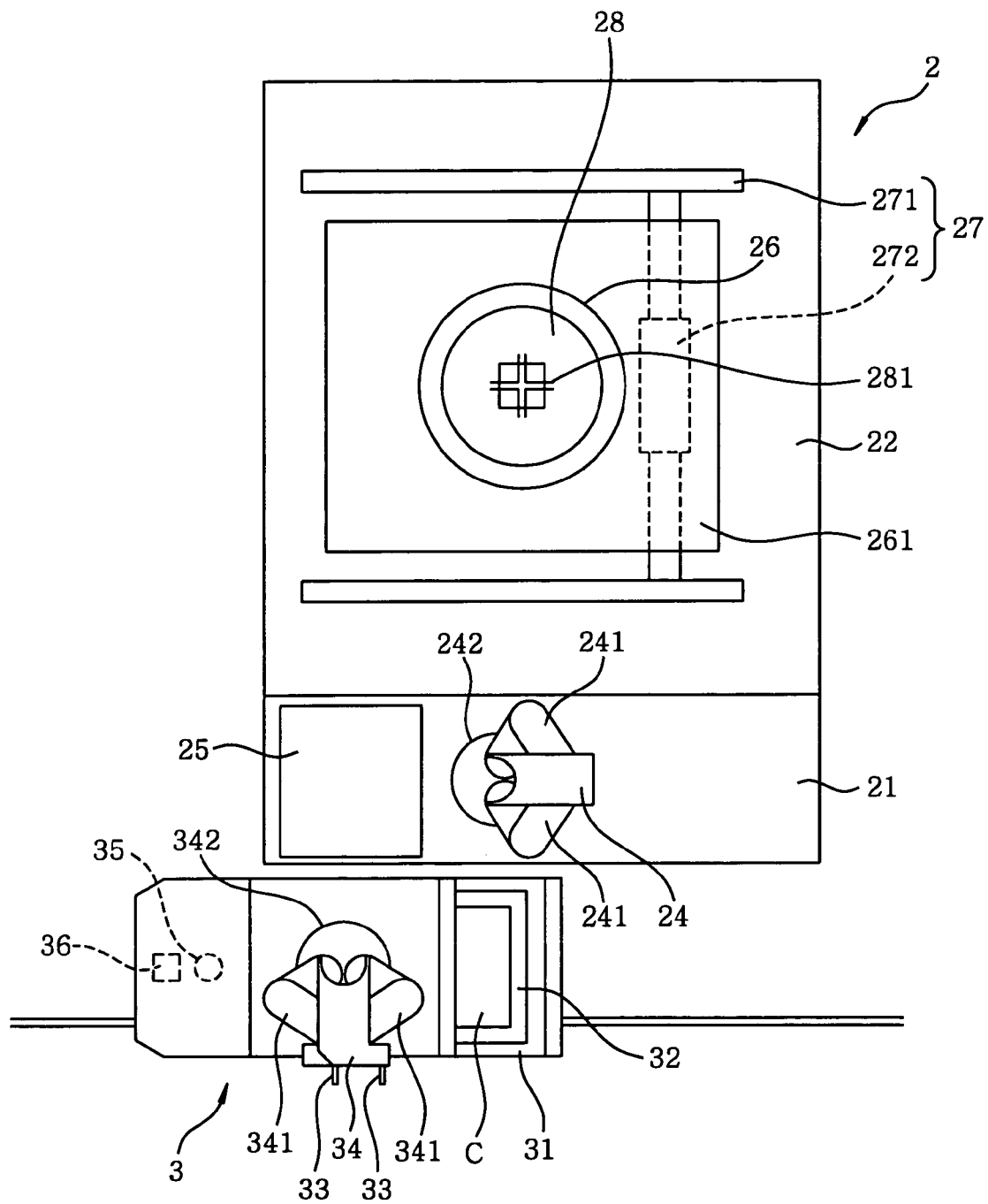
FIG. 2 illustrates a diagram for explaining a relationship between a prober and an RGV in FIG. 1
Figure 3:
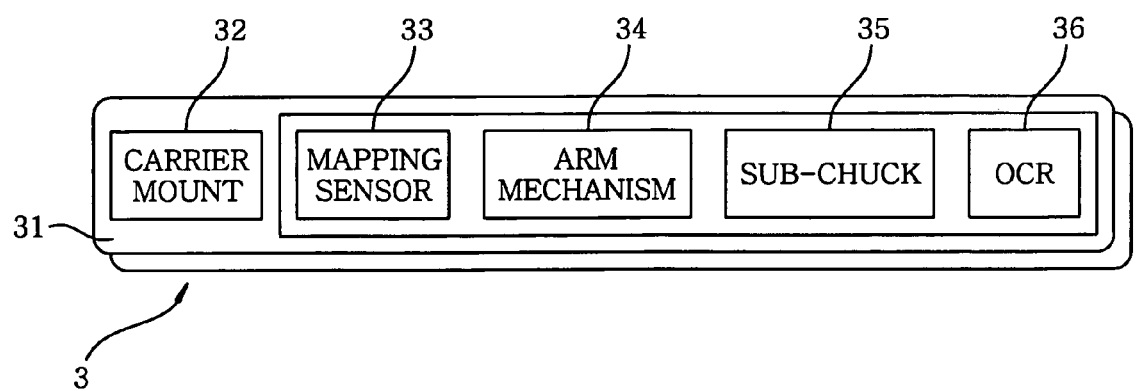
FIG. 3 describes a block diagram depicting a schematic composition of the RGV in FIG. 1.

FIG. 2 illustrates a diagram for explaining a relationship between a prober and an RGV in FIG. 1, and FIG. 3 describes a block diagram depicting a schematic composition of the RGV in FIG. 1.

Referring to FIG. 2, the prober 2 includes a loader chamber 21, a prober chamber 22 and a controller (not shown) Further, the prober 2 drives every unit in the loader chamber 21 and the prober chamber 22 via the controller.

The loader chamber 21 includes a loader chamber transfer arm unit 24 and an adaptor unit 25 to be described later. The loader chamber transfer arm unit 24 has extensible/contractible transfer arms 241 installed in two vertical steps; a base 242 rotatable in a horizontal plane, for supporting each of the transfer arms 241; and a driving mechanism (not shown) accommodated in the base 242, for elevating the base 242. In the load chamber transfer arm unit 24, the wafer W is vacuum-adsorbed by each of the transfer arms 241 or transferred between the prober chamber 22 and the adaptor unit 25 by releasing the vacuum adsorption. Further, each of the transfer arms 241 has a leading end with two prongs, and more specifically, a bifurcated leading end with a semicircular cutout portion. Furthermore, the loader chamber transfer arm unit 24 has a pre-alignment mechanism (not illustrated) for pre-aligning a position of the wafer W and carries out a pre-alignment of the wafer W during the transfer of the wafer W.

The adaptor unit 25, which is separable from the loader chamber 21, is engaged with the loader chamber 21 via a positioning member (not shown), thereby restricting a relative position relationship between the adaptor unit 25 and the loader chamber 21.

The prober chamber 22 has a main chuck 26 for vacuum-adsorbing the loaded wafer W, an alignment mechanism 27 and a probe card 28. The main chuck 26 moves on an X-Y table 261 in the X and the Y direction and, at the same time, moves in the Z and the θ direction by an elevating mechanism and a θ rotation unit (both being not shown). As well known, the alignment mechanism 27 has an alignment bridge 271, a CCD camera 272 or the like and aligns the wafer W and the probe card 28 together with the main chuck 26. The probe card 28 has a plurality of probes 281. Each of the probes 281 is electrically contacted with the wafer W on the main chuck 26. Further, the probe card 28 is connected to the tester 6 via a test head (not shown).

Moreover, as depicted in FIGS. 2 and 3, the RGV 3 includes an apparatus main body 31; a carrier mount 32 provided at one end portion of the apparatus main body 31, for mounting thereon a carrier C; a mapping sensor 33 for detecting a position of each wafer W accommodated in the carrier C; an RGV arm mechanism 34 for transferring the wafer W between the carrier C and the adaptor unit 25; a sub-chuck 35 for pre-aligning the wafer W; an optical pre-alignment sensor (not shown); and an optical character recognizer (OCR) 36 for reading an ID code (not shown) of the wafer W. The carrier C mounted on the carrier mount 32 has therein a plurality of wafers W of different diameters. For example, as shown in FIG. 2, the carrier C is vertically divided into an upper portion for accommodating therein wafers having a diameter of 200 mm and a lower portion for accommodating therein wafers having a diameter of 300 mm.

As illustrated in FIG. 2, the RGV arm mechanism 34 includes extensible/contractible transfer arms 341 installed in two vertical steps, for vacuum-adsorbing the wafer W; a base 342 rotatable in a horizontal plane, for supporting each of the transfer arms 341; and a driving mechanism (not shown) accommodated in the base 342, for elevating the base 342. As same as the transfer arms 241, each of the transfer arms 341 has a leading end with two prongs, and more specifically, a bifurcated leading end with a semicircular cutout portion. Furthermore, each of the transfer arms 341 has at least one leading end portion (a pair of tweezer) for mounting thereon the wafer W. For example, in this embodiment, the upper transfer arm 341 may have two pairs of tweezers and the lower transfer arm 341 may have a pair of tweezers. Accordingly, the upper transfer arms 341 can transfer two wafers W simultaneously.

In the RGV transfer arm 34, when the wafer W is transferred between the carrier C and the adaptor unit 25, the upper and the lower transfer arms 341 separately extend and contract on the base 342 by a driving mechanism. Further, the base 342 rotates in a direction of transferring the wafer W, e.g., in a direction of approaching the adaptor unit 25, and also elevates to a height where the wafer W is transferred, e.g., to a height of the adaptor unit 25.

In the substrate inspecting system, the RGV 3 travels by itself between the stocker 10 and the probers 2 via a wireless communication with the RGV controller 4, thereby transferring the carrier C. Then, the RGV arm mechanism 34 supplies the wafers W accommodated in the carrier C to the probers 2 at least one by one, e.g., two at a time. When the RGV 3 reaches a position where the wafers W are transferred to the probers 2 under the control of the RGV controller 4, the RGV arm mechanism 34 of the RGV 3 is driven, thereby unloading the wafers W from the carrier C at least one by one, e.g., two at a time. Further, when the RGV arm mechanism 34 transfers the wafers W to the adaptor unit 25 of the probers 2, specifications or the like of the wafers W are transferred through an optically coupled PIO communication from the RGV 3 to the probers 2, so that each of the wafers W is transferred together with information thereon.

Further, the RGV 3 may directly transfer the wafers W themselves between the stoker 10 and the probers 2 without using the carrier C. In this case, the wafers W are unloaded from the stoker 10 by the RGV arm mechanism 34 and then mounted on the leading end portion thereof. Next, the RGV 3 moves from the stoker 10 to the probers 2 in a state where the wafers W are mounted on the RGV arm mechanism 34. Thereafter, the RGV arm mechanism 34 supplies the wafers W mounted thereon to the probers 2 (without using the carrier C). When the RGV 3 moves, two or more wafers W may be mounted on the RGV arm mechanism 34.

Hereinafter, the adaptor unit 25 as the substrate transfer apparatus in accordance with the preferred embodiment of the present invention will be described.

Figure 4:
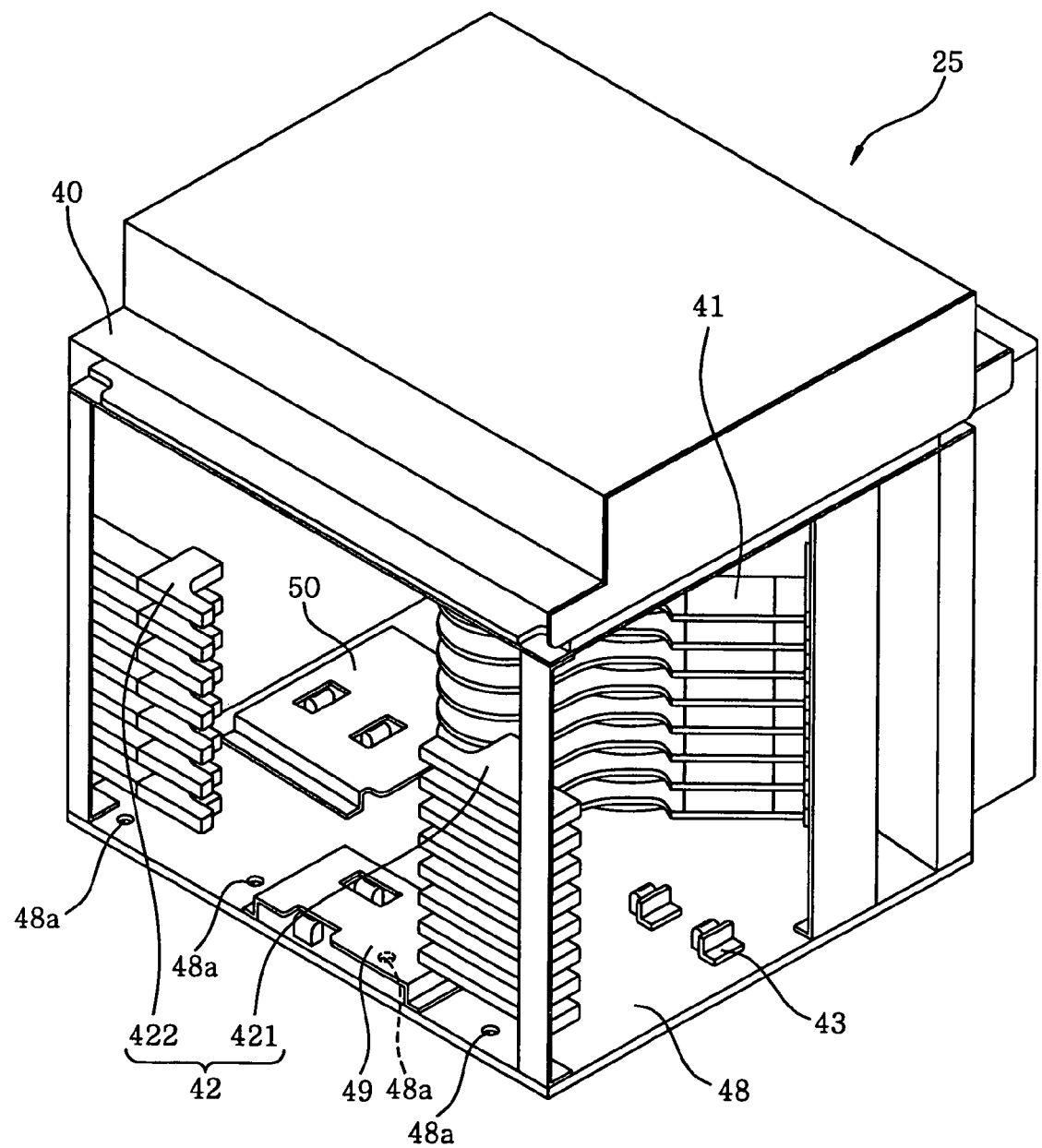
FIG. 4 provides a perspective view illustrating an exterior of an adaptor unit as the substrate transfer apparatus in accordance with the preferred embodiment of the present invention.
Figure 5:
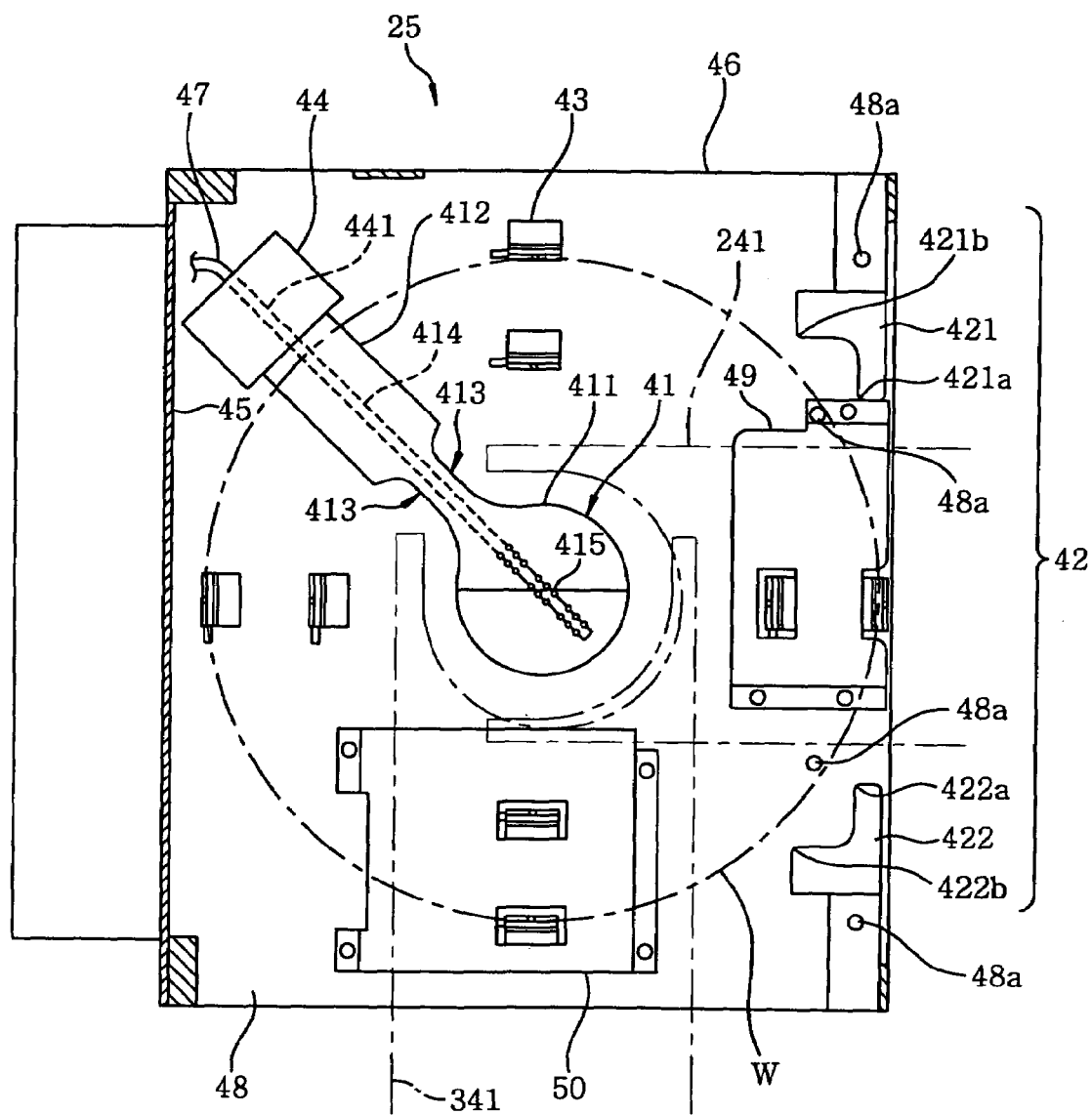
FIG. 5 presents a horizontal sectional view showing a schematic composition of the adaptor unit of FIG. 4.

FIG. 4 provides a perspective view illustrating an exterior of an adaptor unit as a substrate transfer apparatus in accordance with a preferred embodiment of the present invention; and FIG. 5 presents a horizontal sectional view showing a schematic composition of the adaptor unit of FIG. 4.

Referring to FIGS. 4 and 5, the adaptor unit 25 includes a box-shaped main body 40; a plurality of stage arms 41 disposed in the main body 40, serving as substrate mounting members; wafer position alignment mechanisms 42 provided as many as the number of the stage arms 41 in the main body 40; and a plurality of optical sensors 43 provided on a bottom surface 48 and a ceiling surface (not shown) facing each other.

The main body 40 has three open sides. Specifically, as illustrated in FIG. 2, the three open sides of the main body 40 includes a side facing the loader chamber transfer arm mechanism 24 of the prober 2, a side facing the RGV arm mechanism 34 of the RGV 3 corresponding to the prober 2 and a side opposite to the side facing the RGV arm mechanism 34. Each of the open sides is substantially entirely opened. The transfer arm 241 of the loader chamber transfer arm 24 and the transfer arm 341 of the RGV arm mechanism 341 move into the main body 40 through the corresponding open sides, respectively.

As depicted in FIG. 5, each of the stage arms 41 includes a disc-shaped wafer supporting portion 411 provided at an approximately central portion of the main body 40; and a flat body 412 disposed in the main body 40 so as not to interfere with moving paths of the transfer arms 241 and 341. Moreover, moving directions of the transfer arms 341 and 241 are at right angles to each other. Accordingly, as shown in FIG. 5, the body 412 is preferably oriented at an angle of 135° C. in a counterclockwise direction with respect to the moving direction of the transfer arm 241 and at an angle of 135° C. in a clockwise direction with respect to the moving direction of the transfer arm 341.

Since the wafer supporting portion 411 and the body 412 are disposed in parallel with the bottom surface 48, the stage arms 41 are in parallel with the bottom surface 48. A radius of the wafer supporting portion 411 is set to be smaller by a specific value than those of the semicircular cutout portions in the leading ends of the transfer arms 241 and 341 so as not to interfere with the leading ends of the transfer arms 241 and 341 moving into the main body 40. One end of the body 412 is fixed to a supporting column 44 extending upwardly from the bottom surface 48 near a corner portion formed by the sides 45 and 46 opposite to the open sides through which the transfer arms 241 and 341 are moved into the main body 40, respectively, while the other end thereof is connected to the wafer supporting portion 411.

Formed at a connecting portion of the wafer supporting portion 411 and the body 412 are cutout portions 413 for preventing interference between the stage arm 41 and the leading end portions of the transfer arms 241 and 341 moving into the main body 40. The cutout portions 413 are formed at both sides of the body 412 for the transfer arms 241 and 341, respectively, so that the connecting portion of the wafer supporting unit 411 and the body 412 in the stage arm 41 has a bottleneck shape.

With the wafer supporting portion 411 supporting a central portion of the wafer W loaded by the transfer arm 241 or 341 into the main body 40, the stage arm 41 mounts thereon the wafer W. Accordingly, the adaptor unit 25 temporarily keeps the wafer W. Thereafter, the transfer arm 241 or 341 unloads the wafer W supported by the wafer supporting portion 411. Since the wafer W is temporarily kept by the wafer supporting portion 411 between the loading and the unloading process carried out by the transfer arm 241 or 341, the adaptor unit 25 performs the conveyance of the wafer W.

Besides, the stage arm 41 has therein a vacuum exhaust line 414 extending through the body 412. One end portion of the vacuum exhaust line 414 is opened at a wafer supporting surface of the wafer supporting portion 411 via a plurality of through holes 415, while the other end portion thereof communicates with a through hole 441 penetrating the supporting column 44. The through hole 441 is connected to the vacuum exhaust line 47 which is in turn connected to a vacuum exhaust system (not shown) provided at an outside. Accordingly, the stage arm 41 vacuum-adsorbs the wafer W supported by the wafer supporting portion 411.

In the adaptor unit 25, a plurality of, e.g., eight, stage arms 41 are vertically disposed spaced apart from each other at specific intervals of, e.g., 20 mm from the bottom surface 48 toward the ceiling surface. Further, the number of stage arms 41 is not limited to eight, and any number of stage arms may be provided within a range of 8 to 13 stage arms.

The wafer position alignment mechanism 42 includes locating blocks 421 and 422 (substrate contact member) with a L-shape as viewed from above. The locating blocks 421 and 422 are symmetrically arranged with respect to a moving track of the center of the wafer W transferred by the transfer arm 241 of the loader chamber transfer arm mechanism 24, i.e., with respect to a direction in which the wafer W is transferred by the transfer arm 241. As will be described later, a peripheral portion of the wafer w transferred by the transfer arm 241 is contacted with the locating blocks 421 and 422, thereby carrying out a position alignment of the wafer W.

In case a diameter of the wafer W is 300 mm, the peripheral portion of the wafer W is set to be in contact with each of the locating blocks 421 and 422 at the L-shaped end portions thereof, i.e., at two locations. Moreover, contact portions 421a, 421b, 422a and 422b of the locating blocks 421 and 422 with the wafer W have an arc shape as viewed from above (in a direction vertical to a surface of a substrate). Accordingly, the wafer W comes in point contact with each of the contact portions. Further, the contact portions 421a, 421b, 422a and 422b are linearly formed along a vertical direction to the bottom surface 48 (the vertical direction to the surface of the substrate) (hereinafter, referred to simply as "vertical direction"). In other words, each shape of the contact portions 421a, 421b, 422a and 422b does not vary in the vertical direction.

In the wafer position alignment mechanism 42, the locating blocks 421 and 422 are placed at a same height from the bottom surface 48. The locating blocks 421 and 422 are fixed along an edge of the main body 40 with bolts. At this time, the height of the locating blocks 421 and 422 from the bottom surface 48 is adjusted by a height adjustment jig (not shown). Punched in the bottom surface 48 is jig engaging holes 48a for specifying a position of the height adjustment jig with respect to the adaptor unit 25.

The wafer position alignment mechanisms 42 as many as the number of the stage arms 41, e.g., eight wafer position alignment mechanisms 42, are installed in the adaptor unit 25. The respective stage arms 41 and the locating blocks 421 and 422 of the respective position alignment mechanisms 42 corresponding thereto are formed by separate members and correspond to each other in one-to-one relationship. Further, the stage arms 41 and the locating blocks 421 and 422 of the wafer position alignment mechanisms 42 respectively corresponding thereto are spaced at regular intervals in the vertical direction. To be specific, a vertical distance from the wafer supporting surface of the wafer supporting portion 411 to a bottom surface of the locating block 421 (422) is set to be 8 mm to 11 mm, for example.

Furthermore, the adaptor unit 25 has a plurality of, e.g., eight, optical sensors 43 on each of the bottom surface and the ceiling surface thereof. Four optical sensors 43 are disposed on the bottom surface 48 to face a peripheral portion of the wafer W mounted on the stage arm 41 when the wafer has a diameter of 300 mm. Such four optical sensors 43 are spaced from each other at same angular intervals along a circumferential direction. The other four optical sensors 43 on the bottom surface 48 are disposed to face the peripheral portion of the wafer W mounted on the stage arm 41 when the wafer W has a diameter of 200 mm. Such four optical sensors 43 are also spaced from each other at same angular intervals along a circumferential direction. Optical sensors 43 provided on the ceiling surface are disposed so as to correspond to the aforementioned optical sensors 43 disposed on the bottom surface 48. In a pair of the corresponding optical sensors 43 on the bottom surface 48 and the ceiling surface, light is irradiated from one optical sensor 43 to the other. Based on whether or not the other optical sensor 43 receives light, a misalignment of the wafer W is detected.

Each of the optical sensors 43 has a wiring (not shown) to be connected to a detection result analysis apparatus (not shown) provided at an outside. Thus, in case the wirings protrude into the main body 40, they may interfere with the transfer arm 241 or 341. To that end, in this embodiment, wiring covers 49 and 50 for covering the wirings of the optical sensors 43 disposed below the approach path of the transfer arm 241 or 341 are provided on the bottom surface 48. Accordingly, it is possible to prevent the interference between each wiring and the transfer arm 241 or 341.

Although the adaptor unit 25 has wirings or piping for each component in addition to the aforementioned components, those are omitted in FIGS. 4 and 5.

In accordance with the aforementioned adaptor unit 25, since a central portion of the wafer W stored in the main body 40 of the adaptor unit 25 is supported by the wafer supporting portion 411, it is possible to avoid an inclination of the wafer W and to support various wafers having different sizes (e.g., wafers with diameters of 300 mm and 200 mm). Accordingly, the wafer W can be properly transferred. Further, since the stage arm 41 has cutout portions 413 for preventing the stage arm 41 from interfering with the two prongs of the leading end portions of the moving transfer arms 241 and 341, the interference between the stage arm 41 and the transfer arm 241 or 341 can be prevented and, accordingly, a misalignment and a drop of the wafer W can also be prevented. As a result, it is possible to properly transfer the wafer W along the moving directions of the transfer arms 241 and 341.

The wafer supporting portion 411 of the stage arm 41 has a disc-shape. Thus, the wafer W can be stably supported and, accordingly, the inclination of the wafer W can be certainly prevented. Further, since the stage arm 41 vacuum-adsorbs the wafer W with the help of the vacuum exhaust line 414 and the plurality of through holes 415, the misalignment and the drop of the wafer W can be certainly prevented.

The adaptor unit 25 has the optical sensors 43 disposed on the bottom surface 48 and the ceiling surface so as to face the peripheral portion of the wafer W mounted on the stage arm 41. Therefore, the misalignment of the wafer W can be certainly detected and, accordingly, it is possible to prevent the drop of the wafer W or the like in advance.

The adaptor unit 25 has the plurality of stage arms 41. Thus, while a wafer W is being detected, another wafer W can be kept in the main body 40. Accordingly, the flexibility in the transfer of the wafer can be increased in the substrate inspecting system E.

Moreover, the adaptor unit 25 has the locating blocks 421 and 422 provided symmetrically with respect to the direction in which the wafer W is transferred by the transfer arm 241, and the wafer W transferred by the transfer arm 241 is contacted with the locating blocks 421 and 422, so that it is possible to carry out a position alignment of the wafer W with respect to the transfer arm 241. Accordingly, the misalignment of the wafer W can be certainly prevented, thereby enabling to effectively transfer the wafer W.

The contact portions 421a, 421b, 422a and 422b of the locating blocks 421 and 422 with the wafer W have an arc shape as viewed from above. Thus, the wafer W comes in point contact with each of the contact portions, which increases the flexibility of the contact position. As a result, the wafer W can stably contact with the locating blocks 421 and 422.

Further, also in case of a different sized wafer W, a peripheral portion of the wafer W can be stably in contact with each of the contact portions.

Since the contact portions 421a, 421b, 422a and 422b of the locating blocks 421 and 422 are linearly formed in a vertical direction, it is possible to increase the flexibility of the contact position between the wafer W and the contact portions in the vertical direction. Accordingly, the wafer W can be stably contacted with the locating blocks 421 and 422.

The wafer position alignment mechanism 42 having the locating blocks 421 and 422 is provided as many as the number of the stage arms 41. Therefore, in case the plurality of stage arms 41 are installed, it is possible to carry out the position alignment of the wafer W mounted on each of the stage arms 41. As a result, an efficiency of the wafer transfer can be improved.

Installed in the bottom surface 48 of the adaptor unit 25 are the jig engaging holes 48a for specifying a position of the height adjustment jig with respect to the adaptor unit 25, the height adjustment jig serving to adjust a height of the respective locating blocks 421 and 422. Accordingly, the position of the height adjustment jig can be stably determined and, thus, the positions of the locating blocks 421 and 422 can be stably adjusted.

In the adaptor unit 25, the respective stage arms 41 and the locating blocks 421 and 422 of the respective wafer position alignment mechanisms 42 are formed by separate members, so that each of the stage arms 41 is not restricted by each of the locating blocks 421 and 422. As a result, a position of the wafer W mounted on each of the stage arms 41 is not restricted by the locating blocks 421 and 422, thereby certainly preventing an inclination of the wafer W. Furthermore, the stage arms 41 and the locating blocks 421 and 422 of the respective wafer position alignment mechanism 42 corresponding thereto are vertically spaced from each other at specific intervals. To be more specific, a vertical distance from the wafer supporting surface of the wafer supporting portion 411 to the bottom surface of the locating blocks 421 and 422 is set to be a value within a range of 8 mm to 11 mm, for example. Accordingly, it is possible to prevent the wafer W transferred between the locating blocks 421 and 422 and the stage arms 41 from interfering with the locating blocks 421 and 422 or with the stage arms 41, thereby enabling to more stably transfer the wafer W.

Since the moving directions of the transfer arms 341 and 241 are at right angle to each other, the transfer arms 241 and 341 can be efficiently arranged. Accordingly, it is possible to miniaturize the substrate inspecting system E having the adaptor unit 25.

Hereinafter, a wafer loading process using the adaptor unit in FIG. 4, as a substrate transfer method in accordance with the preferred embodiment of the present invention, will be described.

Figure 6:
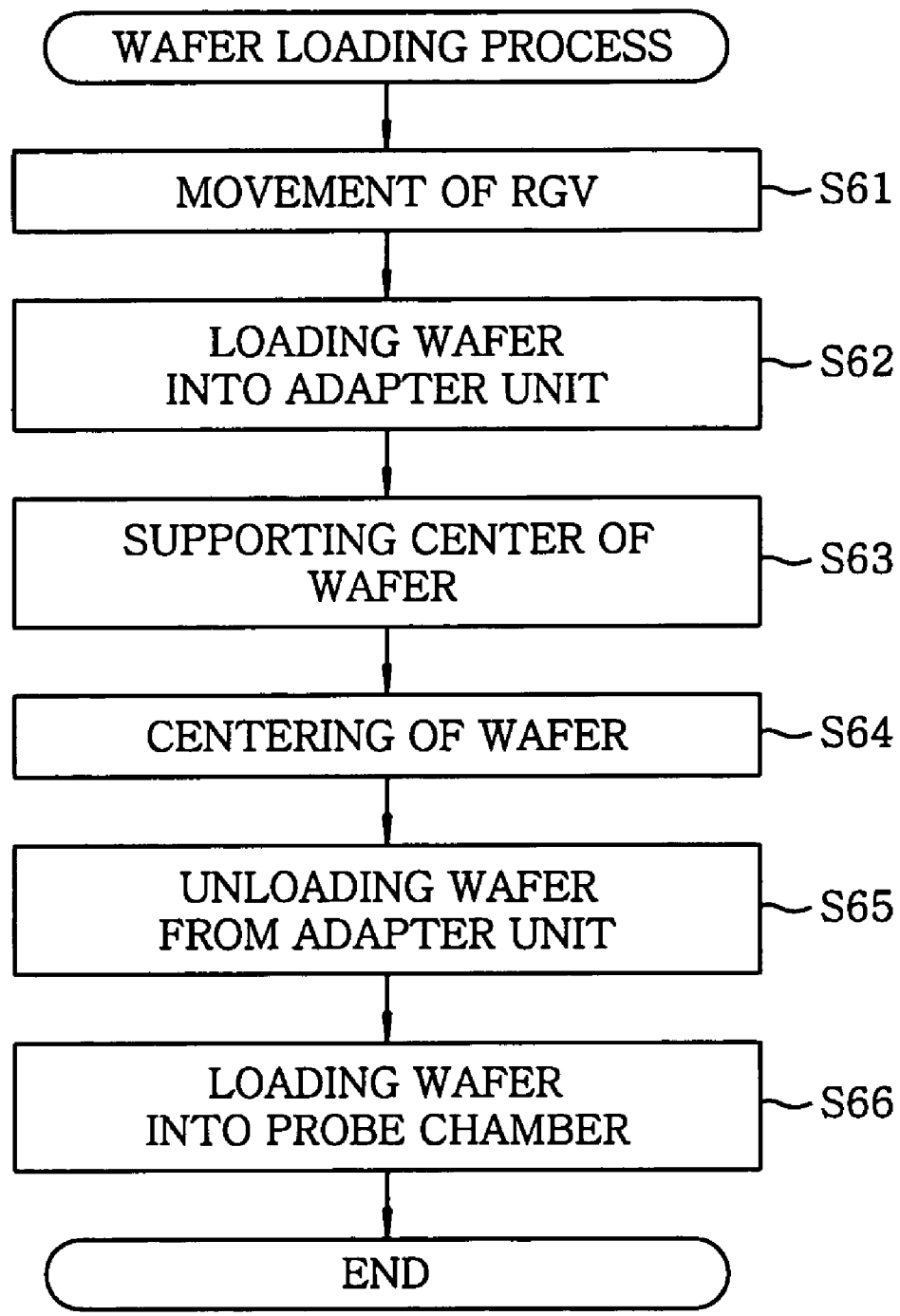
FIG. 6 represents a flow chart of a wafer loading process for loading a wafer from a carrier of the RGV into a prober chamber via the adaptor unit, which is a substrate transfer method in accordance with the preferred embodiment of the present invention.

FIG. 6 represents a flow chart of a wafer loading process for loading a wafer from a carrier of the RGV into a prober chamber via the adaptor unit, which is the substrate transfer method in accordance with the preferred embodiment of the present invention.

Referring to FIG. 6, the RGV 3 controlled by the RGV controller 4 travels by itself to the prober 2 specified by the host computer 1 (step S61). Next, the RGV 3 takes out a wafer W specified by the RGV controller 4 among a plurality of wafers W accommodated in the carrier C with the help of the RGV arm mechanism 34 while transmitting data on specifications of the wafer W to be loaded into the prober 2 through a PIO communication with the prober 2 and then loads the wafer W into the adaptor unit 25 in the prober 2 (step S62).

In the steps S61 and S62, after the RGV arm mechanism 34 takes out the wafer W from the stoker 10 and mounts the wafer W on a leading end portion thereof, the RGV 3 may travel by itself from the stoker 10 to the prober 2 while the RGV arm mechanism 34 mounting thereon the wafer W.

In the step S62, when the wafer W is loaded into the adaptor unit 25, in the RGV arm mechanism 34, the base 342 adjusts a height of the transfer arm 341 such that the wafer W and the transfer arm 341 for transferring such wafer W are positioned above the stage arms 41. Accordingly, when the transfer arm 341 moves into the main body 40, it is possible to prevent interference between the stage arm 41 and the wafer W or the transfer arm 341. Further, in the RGV arm mechanism 34, the transfer arm 341 is extended into the main body 40, thereby loading the wafer W into the adaptor unit 25.

Thereafter, the transfer arm 341 that has been introduced into the main body 40 is extended to a position where the cutout portion in the leading end of the transfer arm 341 accommodates therein the wafer supporting portion 411 of the stage arm 41, and more specifically, to a position where a center of the wafer W mounted on the transfer arm 341 substantially coincides with that of the wafer supporting portion 411. Then, the transfer arm 341 is lowered below the surface of the stage arm 41. While the transfer arm 341 is lowered, the wafer W mounted on the transfer arm 341 is delivered to the wafer supporting portion 411, and the wafer supporting portion 411 supports the central portion of the wafer W (step S63). Accordingly, the wafer W is mounted on the stage arm 41.

Next, in the loader chamber transfer arm mechanism 24, the base 242 adjusts the height of the transfer arm 241 such that the transfer arm 241 is vertically positioned between the backside of the wafer W mounted on the stage arm 41 and the top surfaces of the locating blocks 421 and 422 of a wafer position alignment mechanism 42 disposed right under a wafer position alignment mechanism 42 corresponding to the stage arm 41. Specifically, the height of the transfer arm 241 is adjusted such that the top surface of the transfer arm 241 is positioned 4 mm below the surface of the stage arm 41. Accordingly, when the transfer arm 241 moves into the main body 40, it is possible to prevent interference between the transfer arm 241 and the wafer W or the locating blocks 421 and 422. Further, the transfer arm 241 is extended into the main body 40. The transfer arm 241 that has been introduced into the main body 40 carries out a position alignment of the wafer W together with the locating blocks 421 and 422 of the wafer position alignment mechanism 42 (step S64), as will be described later.

FIGS. 7 and 8 provide process charts of the wafer position aligning process. Diagrams of FIG. 7 illustrate the stage arm 41, the transfer arm 241 and the like as viewed from a side, and those of FIG. 8 depict such components as viewed from above. In FIGS. 7 and 8, a wafer W to be subjected to a position aligning process has a diameter of 300 mm.

Figure 7A:
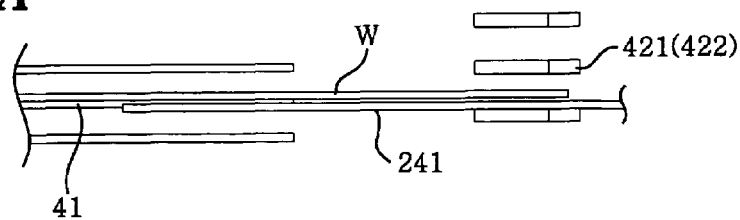
FIG. 7 offers a flow diagram of a position aligning process of a wafer having a diameter of 300 mm.
Figure 7B:
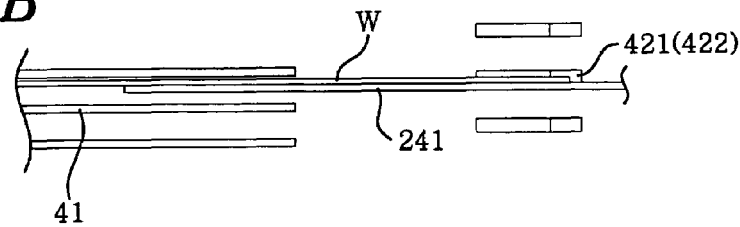
Figure 7C:
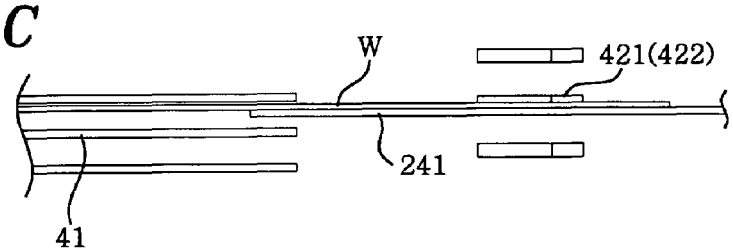
Figure 8A:
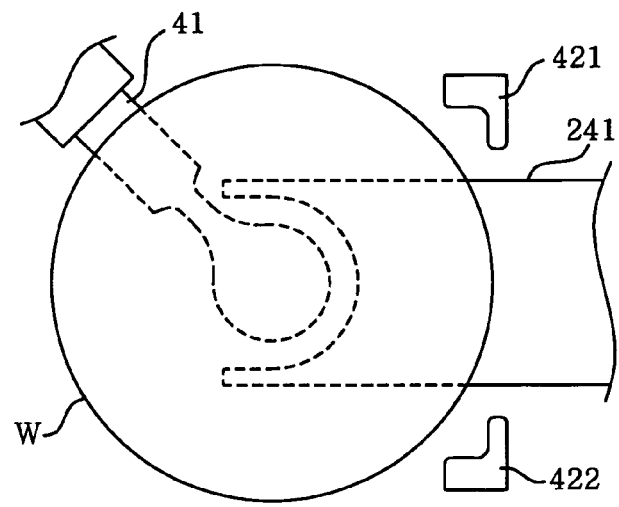
FIG. 8 is a flow diagram of a position aligning process of a wafer having a diameter of 300 mm.
Figure 8B:
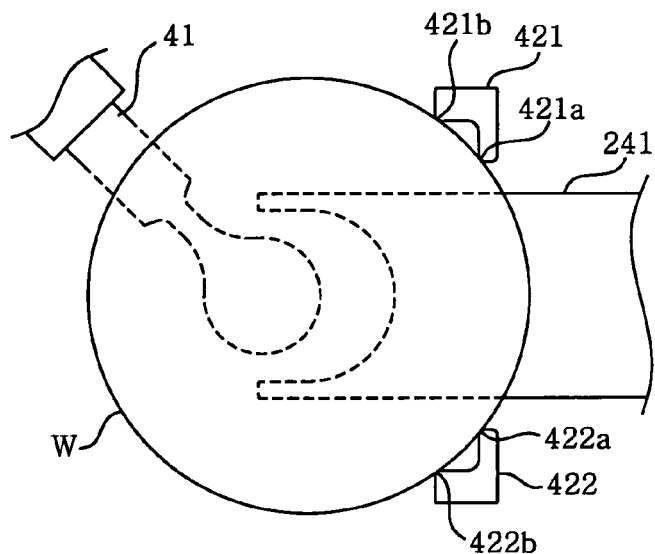

First of all, if the transfer arm 241 that has been introduced into the main body 40 is extended in the forwarding direction of the transfer arm 241 until a center of the semicircular cutout portion in the leading end portion of the transfer arm 241 (hereinafter, referred to as "center of the cutout portion of the transfer arm 241") is positioned ahead of the center of the wafer supporting portion 411 (to the left side in FIG. 7A) by a specific distance of, e.g., 15 mm, the extension is stopped (see FIG. 7A).

Next, the transfer arm 241 is vertically elevated until a surface of the transfer arm 241 is positioned between a bottom surface and a top surface of the locating blocks 421 and 422 corresponding to the stage arm 41. To be specific, the transfer arm 241 is elevated until the surface of the transfer arm 241 is positioned 11 mm above that of the stage arm 41. While the transfer arm 241 is being elevated, the wafer W mounted on the stage arm 41 is delivered to the transfer arm 241 and, then, the wafer W and the transfer arm 241 are elevated together (see FIGS. 7B and 8A). At this time, the wafer W is merely mounted on the transfer arm 241 without being vacuum-adsorbed. Accordingly, the transfer arm 241 can freely move with respect to the wafer W.

Then, the transfer arm 241 is contracted by a specific distance of, e.g., 42.1 mm, while mounting thereon the wafer W. Accordingly, the wafer W mounted on the transfer arm 241 is transferred backward by 42.1 mm (to the right side in FIG. 7C), so that a peripheral portion of the wafer W becomes in contact with the locating blocks 421 and 422. To be more specific, the peripheral portion of the wafer W is contacted at the contact portions 421b and 422b without being contacted at the contact portions 421a and 422a.

At the position where the transfer arm 241 is contracted by 42.1 mm, the center of the wafer W whose position is restricted by the contact with the locating blocks 421 and 422 coincides with that of the cutout portion of the transfer arm 241. At this time, when the wafer W is delivered to the transfer arm 241, the center of the cutout portion of the transfer arm 241 is positioned about 14 mm ahead of the center of the wafer W. Therefore, even if the wafer W is misaligned by about 1 mm, the wafer W is contacted with the locating blocks 421 and 422 during the contraction of the transfer arm 241. After the wafer W comes in contact with the locating blocks 421 and 422, the position of the wafer W is restricted by the locating blocks 421 and 422. However, since the transfer arm 241 can freely move with respect to the wafer W, the transfer arm 241 keeps contracting until it is contracted by 42.1 mm. Accordingly, even if the wafer W is slightly misaligned with respect to the transfer arm 241, the transfer arm 241 is contracted by 42.1 mm while mounting thereon the wafer W, so that the center of the wafer W can coincide with that of the leading end portion of the transfer arm 241. In other words, the position alignment of the wafer W with respect to the transfer arm 241 is carried out (see FIGS. 7C and 8B).

Figure 7D:
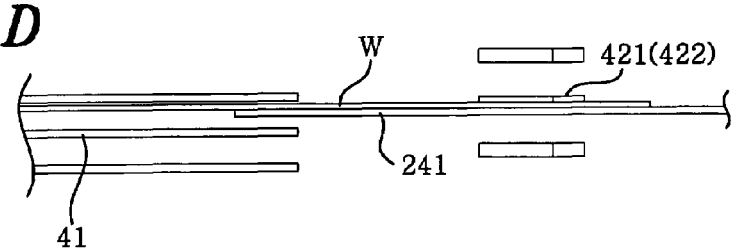
Figure 7E:
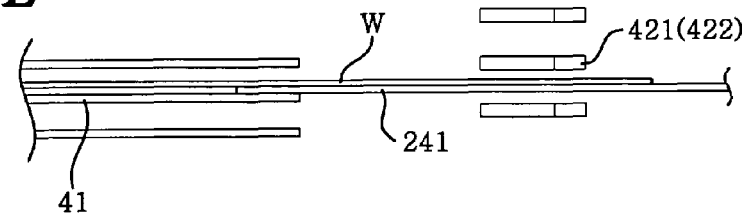
Figure 7F:
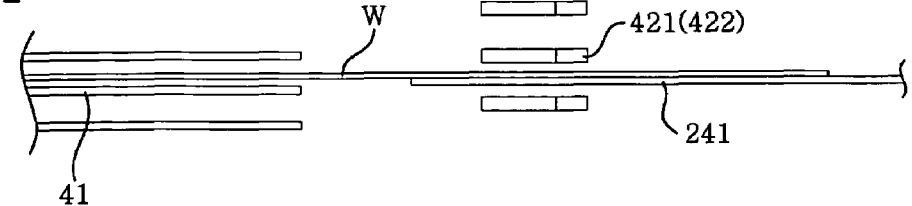
Figure 8C:
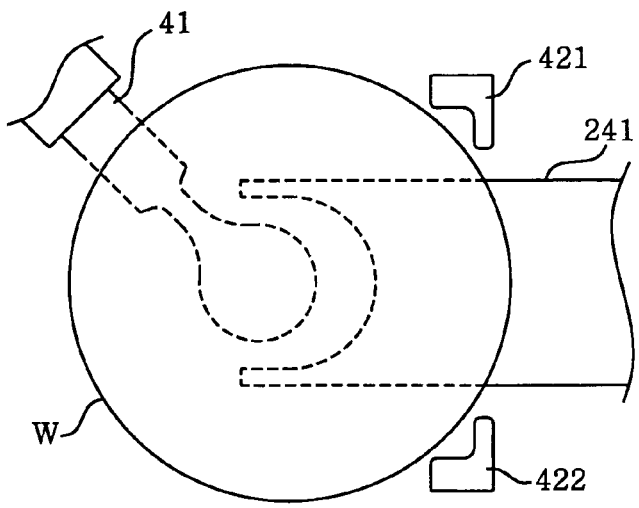

Next, the transfer arm 241 is extended forward by a specific distance of, e.g., 2 mm, while vacuum-adsorbing the position-aligned wafer W (see FIGS. 7D and 8C). Moreover, the transfer arm 241 is lowered such that the surface of the transfer arm 241 is positioned 4 mm above that of the stage arm 41 (see FIG. 7E).

Thereafter, the transfer arm 241 is contracted while vacuum-adsorbing the wafer W. Next, the wafer W is unloaded from the adaptor unit 25 (step S65) and then loaded into the prober chamber 22 (step S66), thereby completing the process.

Although the position alignment of the wafer having a diameter of 300 mm has been described with reference to FIGS. 7 and 8, the wafer W may have a diameter to be contactable with the locating blocks 421 and 422 without being limited to 300 mm as long as the position alignment thereof can be carried out by a cooperation between the transfer arm 241 and the locating blocks 421 and 422 of the wafer position alignment mechanism 42. Hereinafter, as another example, a position aligning process of a wafer having a diameter of 200 mm will be described.

FIG. 9 shows a flow chart of the wafer position aligning process of the wafer having a diameter of 200 mm. Diagrams of FIG. 9 illustrate the stage arm 41, the transfer arm 241 or the like as viewed from above. Each step in the wafer position aligning process of the wafer having a diameter of 200 mm is basically equal to that in the aforementioned wafer position aligning process of the wafer having a diameter of 300 mm except that a contraction level of the transfer arm 241 is different. Therefore, a description of the same steps will be omitted.

Above all, the transfer arm 241 that has entered into the main body 40 stops being extended. Further, the transfer arm 241 is elevated until a surface of the transfer arm 241 is positioned 11 mm above that of the stage arm 41. While the transfer arm 241 is being elevated, the 200 mm diameter wafer W' mounted on the stage arm 41 is delivered to the transfer arm 41 and, then, the wafer W' and the transfer arm

Figure 9A:
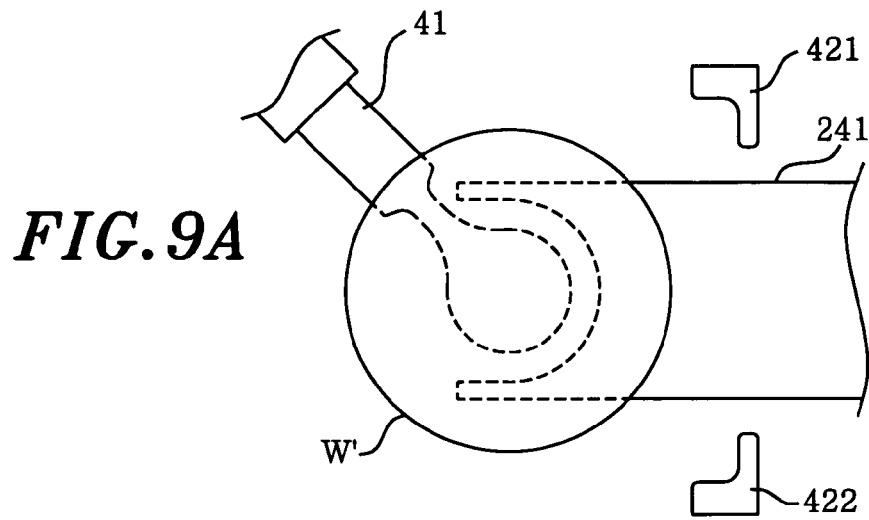
FIG. 9 shows a flow diagram of a position aligning process of a wafer having a diameter of 200 mm.
Figure 9B:
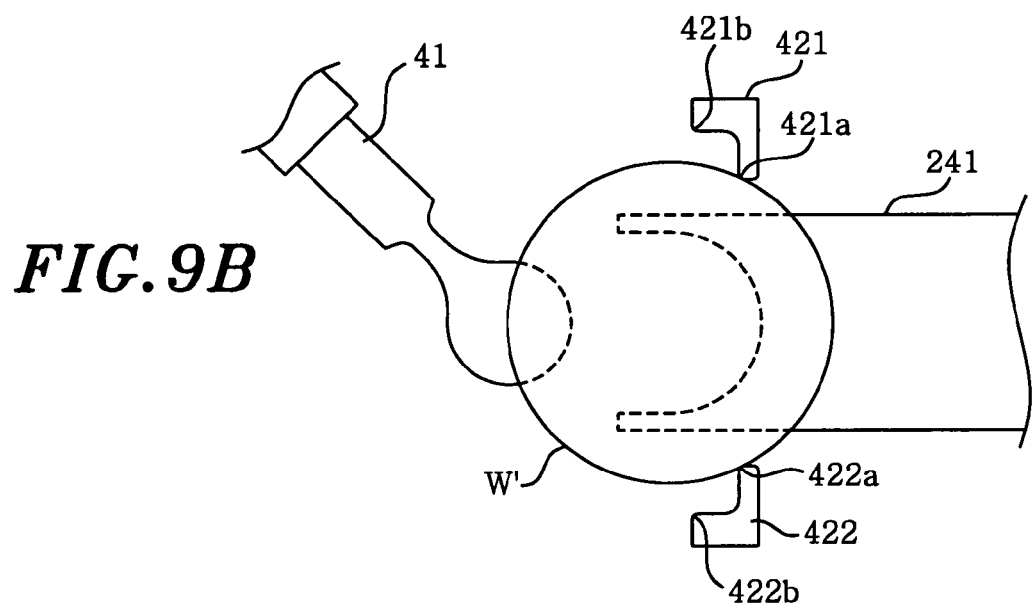
Figure 9C:
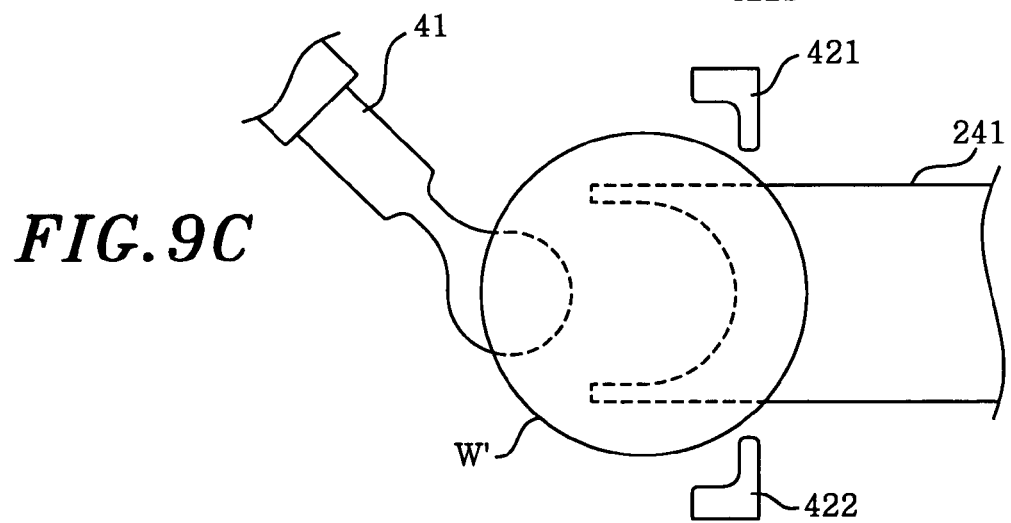
Figure 10:
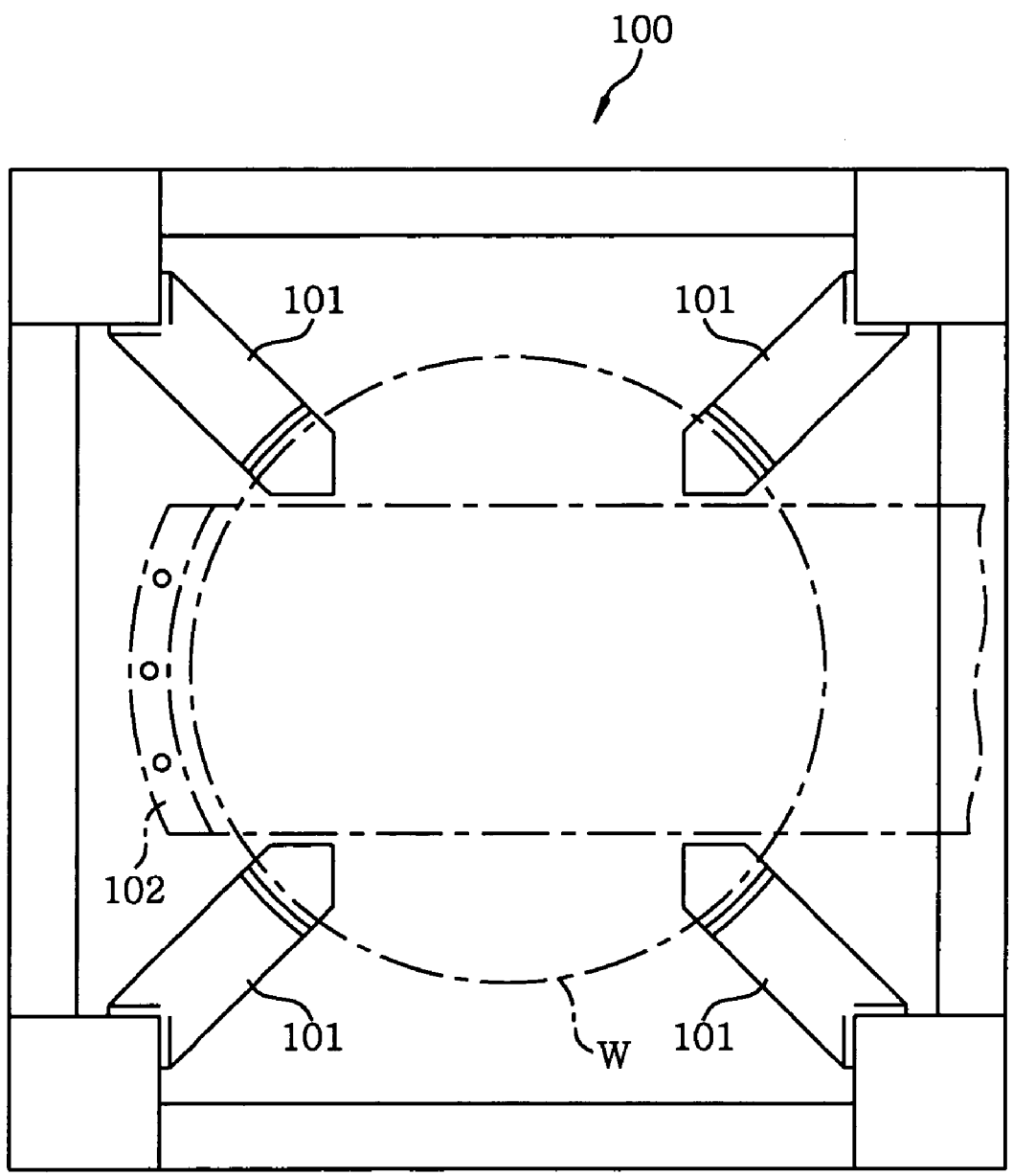
FIG. 10 illustrates a horizontal sectional view showing a schematic composition of a conventional adaptor unit.
Figure 11:
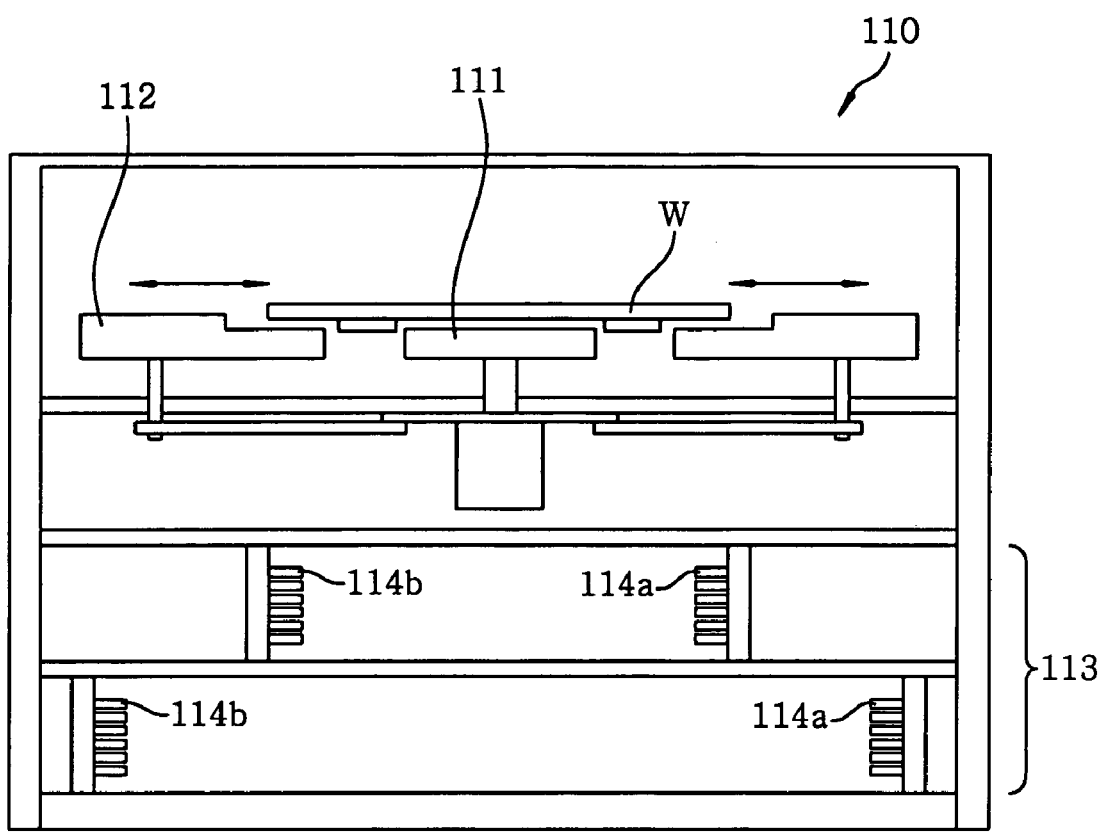
FIG. 11 provides a sectional view depicting a schematic composition of the conventional adaptor unit having a centering device.
Figure 12:
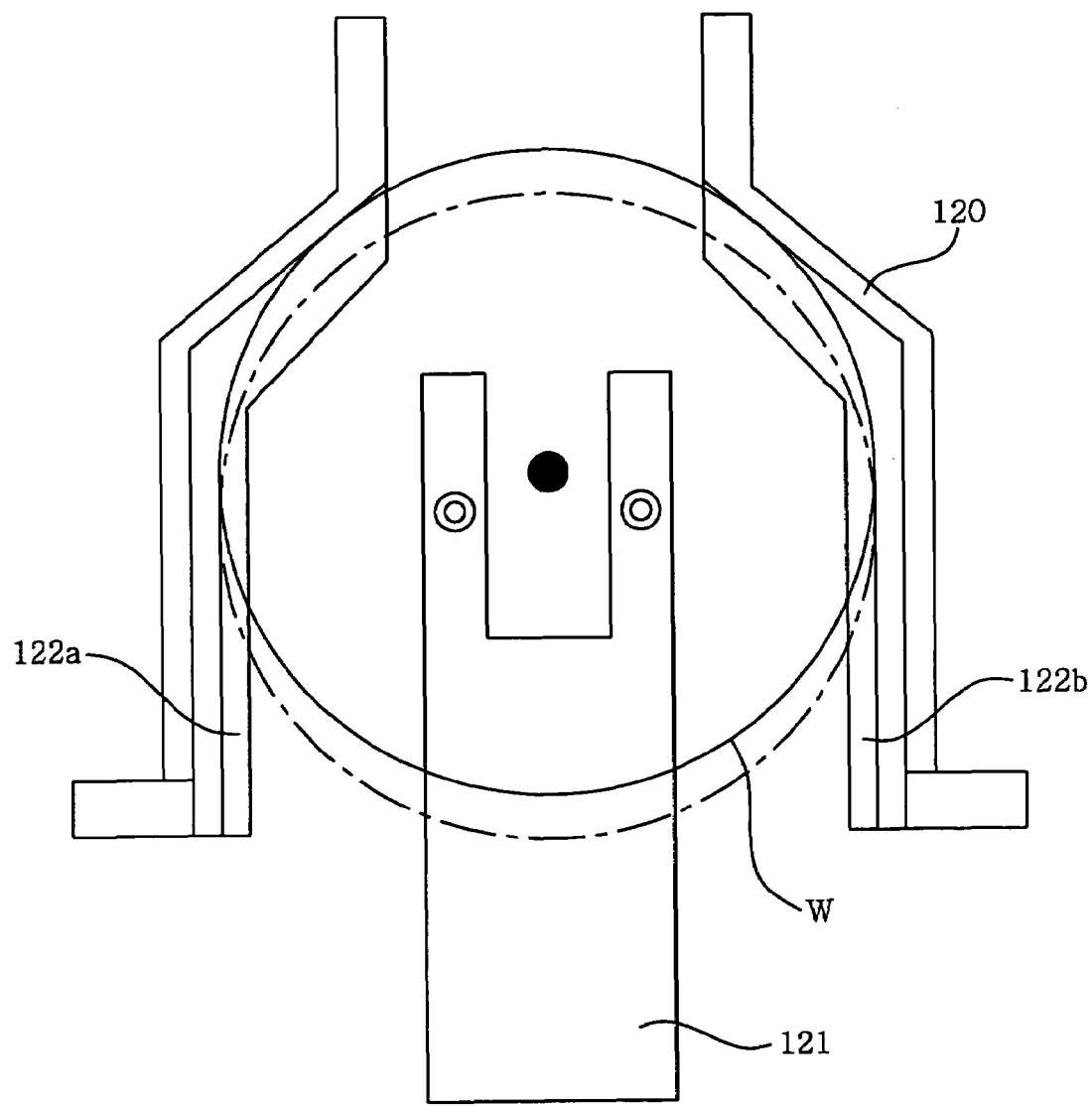
FIG. 12 describes a diagram for explaining a conventional method for correcting a misalignment of a wafer.

241 are elevated together (see FIG. 9A). At this time, the wafer W' is merely mounted on the transfer arm 241 without being vacuum-adsorbed.

Thereafter, the transfer arm 241 is contracted by a specific distance of, e.g., 120.1 mm, while mounting thereon the wafer W'. Accordingly, the wafer W' mounted on the transfer arm 241 is transferred backward by 120.1 mm (to the right side in FIG. 9C), so that a peripheral portion of the wafer W' comes in contact with the locating blocks 421 and 422. To be more specific, the peripheral portion of the wafer W' contacts with the contact portions 421a and 422a without contacting with the contact portions 421b and 422b.

At the position where the transfer arm 241 is contracted by 120.1 mm, the center of the wafer W' whose position is restricted by the contact with the locating blocks 421 and 422 coincides with that of the cutout portion of the transfer arm 241. Even after the wafer W' is contacted with the locating blocks 421 and 422, the transfer arm 241 keeps contracting until it is contracted by 120.1 mm. Accordingly, the position alignment of the wafer W' is carried out (see FIG. 9B).

Then, the transfer arm 241 is extended forward while vacuum-adsorbing the position-aligned wafer W' (see FIG. 9C) and then lowered. Thereafter, the transfer arm 241 is contracted while vacuum-adsorbing the wafer W'. Next, the wafer W' is unloaded from the adaptor unit 40 and then loaded into the prober chamber 22, thereby completing the process.

In accordance with the aforementioned wafer loading process of FIG. 6, the central portion of the wafer W loaded into the adaptor unit 25 is supported by the wafer supporting portion 411 (step S63). Therefore, an inclination of the wafer W can be prevented and, accordingly, the wafer W can be properly transferred.

Further, in accordance with the wafer position aligning process of FIGS. 7 and 8, the peripheral portion of the wafer W transferred by the transfer arm 241 is contacted with the locating blocks 421 and 422 provided symmetrically with respect to a direction in which the wafer W is transferred by the transfer arm 241, thereby enabling to carry out the position alignment of the wafer W with respect to the transfer arm 241.

Furthermore, in accordance with the wafer position aligning process of FIGS. 7 and 8, after the wafer W is contacted with the locating blocks 421 and 422, the position of the wafer W is restricted by the locating blocks 421 and 422. Meanwhile, the transfer arm 241 keeps contracting until it is contracted by 42.1 mm, so that the center of the wafer W can coincide with that of the leading end portions of the transfer arm 241. Moreover, after the transfer arm 241 is contracted by 42.1 mm, the wafer W is transferred forward by a specific distance of, e.g., 2 mm, while being vacuum-adsorbed. Thus, the wafer W can be separated by a distance from the locating blocks 421 and 422 without changing a relative relationship between the transfer arm 241 and the position-aligned wafer W. Accordingly, the wafer W can be properly transferred.

An adaptor unit of a substrate processing system capable of carrying out the wafer position aligning process of FIGS. 7 and 8 is not limited to the adaptor unit 25 shown in FIGS. 4 and 5 and may be one with stage arms for supporting a peripheral portion of a wafer, for example.

Figure 13:
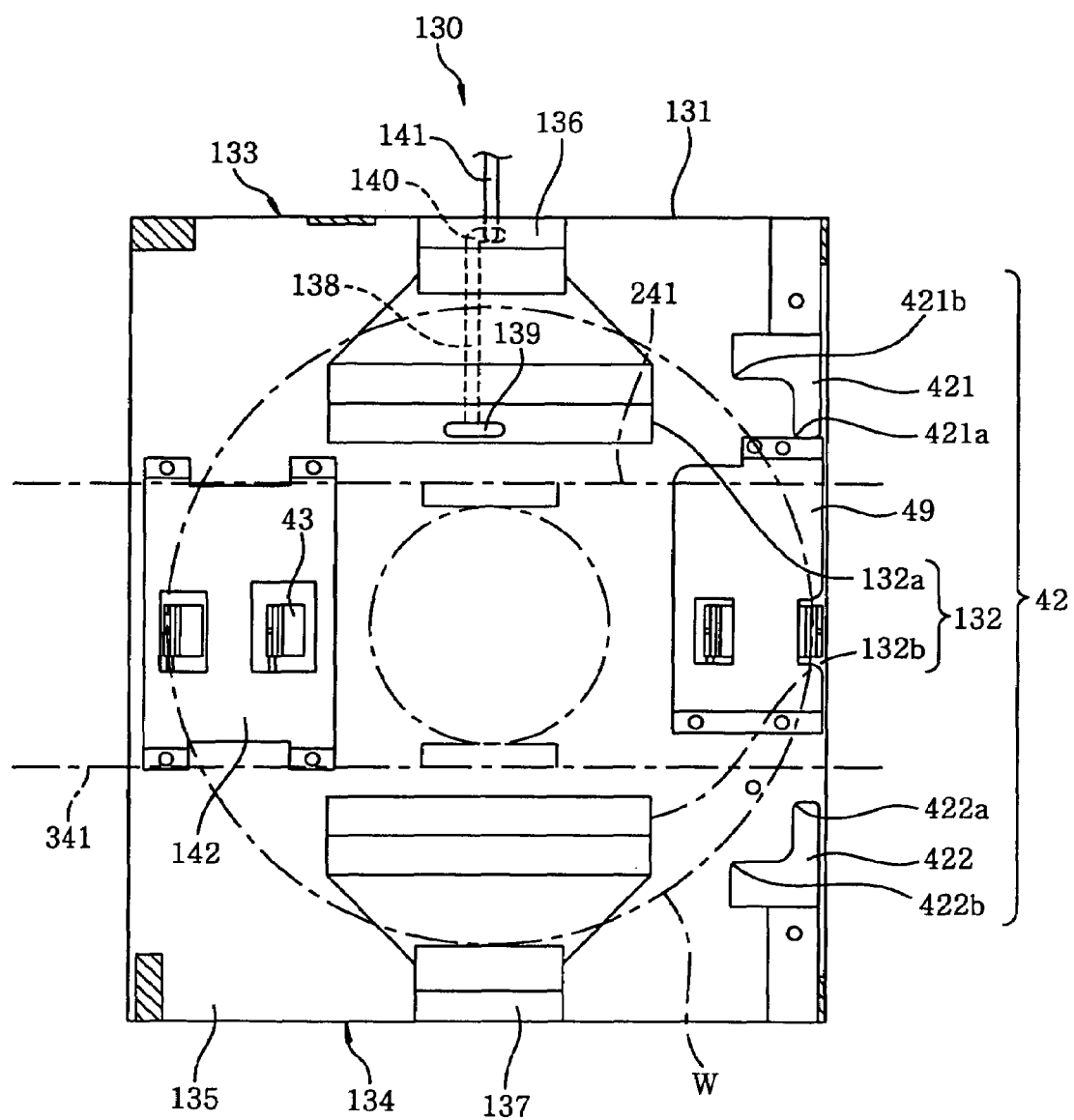
FIG. 13 offers a horizontal sectional view illustrating a schematic composition of an adaptor unit having stage arms for supporting a peripheral portion of a wafer.

FIG. 13 offers a horizontal sectional view illustrating a schematic composition of an adaptor unit having stage arms for supporting a peripheral portion of a wafer.

The adaptor unit of FIG. 13 is different from the adaptor unit illustrated in FIGS. 4 and 5 in that the stage arms for supporting the peripheral portion of the wafer is provided instead of the stage arms for supporting the central portion of the wafer and also in that the moving directions of the transfer arms 341 and 241 are at an angle of 180° C. to each other. Therefore, descriptions of the same compositions and operations will be omitted and, hereinafter, different compositions and operations will be described.

Referring to FIG. 13, the adaptor unit 130 includes a box-shaped main body 131; a plurality of pairs of stage arms 132 disposed in the main body 131, serving as substrate mounting members; and wafer position alignment mechanisms 42 provided as many as the number of the stage arms in pairs 132.

The main body 131 includes at least one pair of open sides opposite to each other. The transfer arm 241 of the loader chamber transfer arm mechanism 24 and the transfer arm 341 of the RGV arm mechanism 34 move into the main body 131 through the open sides, respectively. Herein, the moving directions of the transfer arms 341 and 241 are oriented at an angle of 180° C. to each other.

Each of the stage arms in pairs 132 includes stage arms 132a and 132b disposed to face each other with respect to the moving directions of the transfer arms 341 and 241 (transfer directions of the wafer W). Each of the stage arms 132a and 132b has an approximately fan shape as viewed from above and supports a peripheral portion of the wafer. Further, a distance between the stage arms 132a and 132b facing each other is set to be wider than a width of the transfer arm 341 or 241 as viewed from above, so that interference between the transfer arms and the stage arms 132a and 132b can be prevented, respectively. Moreover, each of the stage arms 132a and 132b is disposed in parallel with the bottom surface 135.

End portions of the respective stage arms 132a and 132b are fixed to supporting columns 136 and 137 extending upwardly from the bottom surface 135 near the sides 133 and 134 other than those through which the transfer arms 241 and 341 are moved, respectively.

By supporting the peripheral portion of the wafer W loaded into the main body 131 with the help of the respective stage arms 132a and 132b of the stage arm in pairs 132, the wafer W is mounted on the transfer arm 241 or 341. Accordingly, the adaptor unit 130 temporarily keeps the wafer W. Thereafter, the transfer arm 241 or 341 unloads the wafer W supported by the respective stage arms 132a and 132b. The wafer W is temporarily kept by the respective stage arms 132a and 132b between the loading and the unloading process carried out by the transfer arm 241 or 341. As a result, the adaptor unit 130 performs the conveyance of the wafer W.

Moreover, the stage arm 132a has a vacuum exhaust line 138 penetrating therethrough. One end portion of the vacuum exhaust line 138 is opened at a wafer supporting surface of the respective stage arms 132a and 132b via through holes 139, while the other end portion thereof communicates with a through hole 140 penetrating the supporting column 136. The through hole 140 is connected to the vacuum exhaust line 141 which is in turn connected to a vacuum exhaust system (not shown) provided at an outside. Accordingly, the stage arm 132a can vacuum-adsorb the wafer W.

In the adaptor unit 25, is a plurality of, e.g., eight, pairs of stage arms 132 are disposed upwardly from the bottom surface 135 toward the ceiling surface spaced apart from each other at specific intervals of 20 mm, for example. Further, the number of stage arms in pairs 132 is not limited to eight, and any number of stage arms in pairs may be provided within a range of 8 to 13 stage arms in pairs.

In the wafer position alignment mechanisms 42, the respective stage arms in pairs 132 and the locating blocks 421 and 422 of the respective wafer position alignment mechanisms 42 are formed by separate members and correspond one-to-one. Further, the stage arms in pairs 132 and the locating blocks 421 and 422 of the wafer position alignment mechanisms 42 corresponding thereto are spaced apart from each other by a specific distance in the vertical direction. To be specific, a vertical distance from the wafer supporting surface of the stage arms 132a and 132b to the bottom surface of the locating blocks 421 and 422 is set to range from 8 mm to 11 mm, for example.

Further, in the adaptor unit 130, wiring covers 49 and 142 for covering wirings of the optical sensors 43 disposed below the moving path of the transfer arm 241 or 341 are provided on the bottom surface 135. Accordingly, it is possible to prevent the interference between the respective wirings and the transfer arm 241 or 341.

In the aforementioned wafer loading process of FIG. 6, after the wafer W is mounted on the stage arm 41, the position alignment of the wafer W is carried out. However, after the wafer W is mounted on the stage arm 41, each of the optical sensors 43 may detect a position of the peripheral portion of the wafer W. Accordingly, it is possible to certainly detect a misalignment of the wafer W, thereby enabling to prevent a drop of the wafer W or the like in advance. In case the detected misalignment amount is smaller than a specific value, the position alignment of the wafer W may be skipped and, accordingly, the wafer loading process can be quickly carried out.

Further, in the aforementioned wafer loading process of FIG. 6, the wafers W are loaded into the adaptor unit 25 sheet by sheet. However, since the RGV arm mechanism 34 of the RGV 3 has two transfer arms 341 and the adaptor unit 25 has the multiple stage arms 41, two wafers W may be simultaneously loaded and, accordingly, the wafers W can be quickly loaded.

Furthermore, in the aforementioned wafer loading process of FIG. 6, neither the loader chamber transfer arm mechanism 24 of the loader chamber 21 nor the RGV arm mechanism 34 of the RGV 3 carries out a pre-alignment of the wafer W. However, when the wafer W is transferred, the loader chamber transfer arm mechanism 24 and the RGV arm mechanism 34 may carry out the pre-alignment of the wafer W. As a result, it is possible to more certainly prevent the misalignment of the wafer W.

The aforementioned adaptor unit 25 is applied to the substrate inspection system E, so that the wafer W can be effectively transferred between the probers 2 and the RGV 3 via the adaptor unit 25. However, the adaptor unit 25 may be applied to another substrate processing system, e.g., an etching processing system having an etching processing apparatus and an AGV. In this case, the wafer W can be effectively transferred between the etching processing apparatus and the AGV via the adaptor unit 25.

In the aforementioned adaptor unit 25, the wafer supporting portion 411 of the stage arm 41 has a disc-shape. However, the shape of the wafer supporting portion 411 is not limited thereto, and the wafer supporting portion may have a shape, e.g., a polygonal shape as long as it does not interfere with the leading end portion of the transfer arm 241 or 341.

The transferred substrate in the present invention is not limited to a wafer for a semiconductor device, and may be various substrates for use in a liquid crystal display (LCD), a flat panel display (FPD) and the like, a photo mask, a CD substrate, a print substrate and the like.

The object of the present invention can also be achieved by supplying a storage medium for storing therein software program codes for implementing functions of the aforementioned embodiments to a computer, e.g., the host computer 1 or the RGV controller 4, and then reading the program codes stored in the storage medium with the help of a CPU of the computer.

In this case, it is considered that the functions of the aforementioned embodiments are implemented by the program codes read by the storage medium, so that the program codes and the storage medium for storing therein the program codes are included in the present invention.

The storage medium for supplying the program codes includes a RAM, a NV-RAM, a Floppy (registered mark) disc, a hard disc, an optical disc, an magneto-optical disc, a CD-ROM, a CD-R, a CD-RW, a DVD (DVD-ROM, DVD-RAM, DVD-RW, DVD+RW), a magnetic tape, a nonvolatile memory card, a ROM and the like capable of storing therein the program codes. Alternatively, the program codes may be supplied to a computer through a download from database or another computer (not shown) connected to the Internet, a commercial network, a local area network or the like.

Further, the functions of this embodiments are achieved not only by executing the program codes read by the computer but also by implementing a partial or an entire actual processing based on instructions of the program codes with the help of an operating system (OS) or the like in the CPU.

In addition, the functions of this embodiments can be implemented by recording the program codes read by the storage medium in a memory having a function extension board inserted in the computer or a function extension unit connected to the computer and then performing a partial or an entire actual processing with the help of the CPU or the like provided in the function extension board or in the function extension unit.

The program codes may include object codes, program codes implemented by an interpreter, script data supplied to the OS and the like.

While the invention has been shown and described with respect to the preferred embodiments, it will be understood by those skilled in the art that various changes and modification may be made without departing from the spirit and scope of the invention as defined in the following claims.

What is claimed is:

1. A substrate transfer apparatus formed of a box-shaped structure having at least two open sides, for temporarily keeping one or more substrates and transferring the substrates to at least two transfer arms introduced therein from the respective two open sides, the apparatus comprising:

one or more substrate mounting members, each of the members including a substrate supporting portion for supporting a central portion of a substrate and a body connected to the substrate supporting portion, the body disposed so as not to interfere with moving paths of the two transfer arms, wherein each of the substrate mounting members has cutout portions corresponding to shapes of leading ends of the two transfer arms, and the cutout portions serve to prevent interference between the two transfer arms and each of the substrate mounting members; and a substrate position alignment mechanism for each of the substrate mounting members to carry out a position alignment of the substrate, wherein each substrate position alignment mechanism has two substrate contact members provided symmetrically with respect to a substrate transfer direction of one of the two transfer arms, the two substrate contact members being contacted with the substrate transferred by said one of the two transfer arms when carrying out the position alignment.

2. The substrate transfer apparatus of claim 1, wherein the substrate supporting portion has a disc-shape.

3. The substrate transfer apparatus of claim 1, wherein each of the substrate mounting members adsorbs the substrate.

4. The substrate transfer apparatus of claim 1, further comprising a substrate misalignment detecting sensor provided at a location corresponding to a peripheral portion of the substrate mounted on the substrate mounting members.

5. The substrate transfer apparatus of claim 1, wherein the number of the substrate mounting members is greater than one.

6. The substrate transfer apparatus of claim 1, wherein contact portions of the substrate contact members with the transferred substrate have an arc shape as viewed in a direction vertical to a surface of the substrate.

7. The substrate transfer apparatus of claim 1, wherein contact portions of the substrate contact members with the transferred substrate are linearly formed along a direction vertical to a surface of the substrate.

8. The substrate transfer apparatus of claim 1, wherein the substrate contact members and the substrate mounting members are formed by separate members, and the substrate contact members are fixed to the box-shaped structure.

9. The substrate transfer apparatus of claim 8, wherein the substrate contact members are disposed in the box-shaped structure.

10. The substrate transfer apparatus of claim 1, wherein the substrate contact members and said each of the substrate mounting members are spaced apart from each other by a specific distance in a direction vertical to the surface of the transferred substrate.

11. The substrate transfer apparatus of claim 10, wherein the specific distance ranges from 8 mm to 11 mm.

12. The substrate transfer apparatus of claim 1, wherein a connecting portion having a bottleneck shape is formed between the substrate supporting portion and the body, and the cutout portions are formed at the connecting portion.

* * * * *